(12) United States Patent
Harper et al.

(10) Patent No.: US 7,994,083 B2
(45) Date of Patent: Aug. 9, 2011

(54) FUSED SILICA GLASS AND METHOD FOR MAKING THE SAME

(75) Inventors: Brian Lee Harper, Painted Post, NY (US); Kenneth Edward Hrdina, Horseheads, NY (US); John Edward LaSala, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 942 days.

(21) Appl. No.: 11/521,683

(22) Filed: Sep. 15, 2006

(65) Prior Publication Data

US 2007/0066477 A1 Mar. 22, 2007

Related U.S. Application Data

(60) Provisional application No. 60/718,009, filed on Sep. 16, 2005, provisional application No. 60/755,807, filed on Dec. 30, 2005.

(51) Int. Cl.
  C03C 3/06 (2006.01)
  C03B 19/01 (2006.01)
  C03B 19/09 (2006.01)
  C03B 19/06 (2006.01)
  C03B 19/00 (2006.01)

(52) U.S. Cl. ............. 501/54; 65/17.3; 65/17.4; 65/17.6; 501/905

(58) Field of Classification Search ................... 501/53, 501/54, 905; 65/17.3, 17.4, 17.6
See application file for complete search history.

(56) References Cited

U.S. PATENT DOCUMENTS

| | | | |
|---|---|---|---|
| 5,616,159 A | 4/1997 | Araujo et al. | 65/17.4 |
| 5,668,067 A | 9/1997 | Aruajo et al. | 501/54 |
| 6,094,941 A | 8/2000 | Fujinoki et al. | 65/30.1 |
| 6,143,676 A * | 11/2000 | Ohashi et al. | 501/54 |
| 6,451,719 B1 * | 9/2002 | Yamagata | 501/54 |
| 6,473,227 B1 | 10/2002 | Yamagata | 359/361 |
| 7,080,527 B2 * | 7/2006 | Kuhn et al. | 65/17.4 |
| 2003/0027705 A1 * | 2/2003 | Nishimura et al. | 501/54 |
| 2003/0115905 A1 * | 6/2003 | Kuhn et al. | 65/17.6 |

* cited by examiner

*Primary Examiner* — Jerry A Lorengo
*Assistant Examiner* — Noah S Wiese
(74) *Attorney, Agent, or Firm* — Robert P. Santandrea; Siwen Chen

(57) ABSTRACT

Disclosed are methods for hydrogen loading silica glass and silica glass comprising loaded $H_2$. The methods can lead to $H_2$ gradient in the glass material. Alternatively, the method may involve the use of varying $H_2$ partial pressure of $H_2$ in the atmosphere. Both can result in expedited hydrogen loading process.

44 Claims, 24 Drawing Sheets

US 7,994,083 B2

FUSED SILICA GLASS AND METHOD FOR MAKING THE SAME

CROSS-REFERENCE TO RELATED APPLICATIONS

The present invention claims priority to U.S. Provisional Patent Application Nos. 60/718,009, filed Sep. 16, 2005 and entitled "Low Distortion Silica Glass for the DUV," and 60/755,807, filed Dec. 30, 2005 and entitled "Fused Silica Glass and Method for Making the Same," the contents of both of which are relied upon and incorporated herein by reference in their entirety.

FIELD OF THE INVENTION

The present invention relates to fused silica glass and method of making the same. In particular, the present invention relates to fused silica glass with low LIWFD, low induced absorption, and low refractive index variation, and method of hydrogen-loading the precursor glass for making the desired fused silica glass. The present invention is useful, for example, in making high purity fused silica glass for use in lithography devices operating in deep UV and vacuum UV wavelength regions.

BACKGROUND OF THE INVENTION

High purity silica glass material has become the material of choice for lens elements used in high-resolution deep UV and vacuum UV projection lithography devices. Excimer laser beams are typically used in those lithography devices. It is known that presence of $H_2$ molecules in the glass is conducive, and indeed sometimes necessary, for the laser damage resistance of silica glass when used at about 248 and 193 nm. Some as-manufactured silica glasses do not contain molecular $H_2$ per se. Thus those skilled in the art have proposed various processes for adding $H_2$ molecules into consolidated silica glass, which is called hydrogen loading.

Teachings regarding the relationship between the distribution of $H_2$ in the silica glass and its optical performance at about 193 nm in terms of LIWFD, refractive index and refractive index homogeneity, and the like, in the prior art, if any, is scant. They provide vague at best, and contradictory at worst, guidance as to the development of a most efficient and effective hydrogen loading process in the process of making silica glass material suitable for use in the refractive lens element of modern lithography devices operating in deep and vacuum UV regions. They mostly teach hydrogen loading at high pressure, and sometimes at high temperature, which are undesirable. Moreover, they invariable require long hydrogen loading time to achieve the stated hydrogen concentration levels. Since hydrogen loading is a diffusion process, and it occurs at a very slow diffusivity rate, it has become one of the most time-consuming and expensive steps in the silica glass manufacture process. Reducing the loading time while achieving acceptable and excellent optical performance is a serious challenge in the art up until the advent of the present invention.

Therefore, there is a genuine need of an efficient and effective process for hydrogen-loading silica glass material to produce material that meets the requirements of lithographic applications operating at a wavelength below about 300 nm, especially in the deep UV and vacuum UV regions, particularly at about 248 nm and 193 nm, and silica glass materials loaded with hydrogen at levels that generate desired optical properties thereof.

The present invention satisfies this long standing need.

SUMMARY OF THE INVENTION

Thus, according to a first aspect of the present invention, provided is a silica glass material capable of being used in the light path of the lithographic irradiation of a lithographic device operating at a wavelength of below about 300 nm doped with molecular hydrogen having an average molecular hydrogen concentration $[H_2](avg)$ not lower than about $5\times10^{15}$ molecules/cm$^3$ and not higher than about $1\times10^{18}$ molecules/cm$^3$, a maximal molecular hydrogen concentration $[H_2](max)$ and a minimal molecular hydrogen concentration $[H_2](min)$, wherein $0.10 \leq [H_2](min)/[H_2](max) \leq 0.95$, in certain embodiments $0.20 \leq [H_2](min)/[H_2](max) \leq 0.95$, in certain embodiments $0.30 \leq [H_2](min)/[H_2](max) \leq 0.95$, in certain other embodiments $0.40 \leq [H_2](min)/[H_2](max) \leq 0.95$, in certain embodiments $0.60 \leq [H_2](min)/[H_2](max) \leq 0.95$, in certain embodiments $0.80 \leq [H_2](min)/[H_2](max) \leq 0.95$, in certain embodiments $0.10 \leq [H_2](min)/[H_2](max) \leq 0.90$, in certain embodiments $0.20 \leq [H_2](min)/[H_2](max) \leq 0.90$, in certain embodiments $0.30 \leq [H_2](min)/[H_2](max) \leq 0.90$, in certain other embodiments $0.40 \leq [H_2](min)/[H_2](max) \leq 0.90$, in certain other embodiments $0.60 \leq [H_2](min)/[H_2](max) \leq 0.90$, in certain other embodiments $0.80 \leq [H_2](min)/[H_2](max) \leq 0.90$, in certain other embodiments $0.10 \leq [H_2](min)/[H_2](max) \leq 0.80$, in certain embodiments $0.20 \leq [H_2](min)/[H_2](max) \leq 0.80$, in certain other embodiments $0.30 \leq [H_2](min)/[H_2](max) \leq 0.80$, in certain other embodiments $0.40 \leq [H_2](min)/[H_2](max) \leq 0.80$, in certain other embodiments $0.60 \leq [H_2](min)/[H_2](max) \leq 0.80$, in certain other embodiments $0.70 \leq [H_2](min)/[H_2](max) \leq 0.80$, in certain other embodiments $0.10 \leq [H_2](min)/[H_2](max) \leq 0.95$, in certain embodiments $0.20 \leq [H_2](min)/[H_2](max) \leq 0.70$, in certain other embodiments $0.30 \leq [H_2](min)/[H_2](max) \leq 0.70$, in certain other embodiments $0.40 \leq [H_2](min)/[H_2](max) \leq 0.70$, in certain other embodiments $0.10 \leq [H_2](min)/[H_2](max) \leq 0.95$, in certain embodiments $0.20 \leq [H_2](min)/[H_2](max) \leq 0.60$, in certain other embodiments $0.30 \leq [H_2](min)/[H_2](max) \leq 0.60$, in certain other embodiments $0.40 \leq [H_2](min)/[H_2](max) \leq 0.60$.

In certain embodiments of the silica glass material of the present invention, the glass has a $[H_2](avg)$ of not higher than about $4\times10^{17}$ molecules/cm$^3$, in certain embodiments not higher than about $2\times10^{17}$ molecules/cm$^3$, in certain embodiments not higher than about $1\times10^{17}$ molecules/cm$^3$.

In certain embodiments of the silica glass material of the present invention, the glass has a $[H_2](avg)$ of not lower than about $1\times10^{16}$ molecules/cm$^3$, in certain embodiments not lower than about $5\times10^{16}$ molecules/cm$^3$.

In certain embodiments of the silica glass material of the present invention, the glass has a low level of LIWFD at about 193 nm.

In certain embodiments of the silica glass material of the present invention, the glass has a low level of FDT at about 193 nm.

In certain embodiments of the silica glass material of the present invention, the glass has a low level of refractive index variation.

In certain embodiments of the silica glass material of the present invention, the glass has a low level of birefringence.

In certain embodiments of the silica glass material of the present invention, the glass has a low level of birefringence variation.

In certain embodiments of the silica glass material of the present invention, the glass has a low level of induced absorption at about 193 nm.

In certain embodiments of the silica glass material of the present invention, the glass has a low level of oxygen molecules.

In certain embodiments of the silica glass material of the present invention, the glass is essentially free of —O—O— bonds.

In certain embodiments of the silica glass material of the present invention, the glass has an average [OH] less than about 100 ppm, in certain embodiments less than about 60 ppm, in certain other embodiments less than about 50 ppm, in certain other embodiments less than about 30 ppm, in certain other embodiments less than about 10 ppm, in certain other embodiments less than about 1 ppm.

In certain embodiments of the silica glass material of the present invention, the glass is OD-doped.

In certain embodiments of the silica glass material of the present invention, the glass is $D_2$ and/or HD doped.

In certain embodiments of the silica glass material of the present invention, the glass is both OD- and $D_2$-doped.

In certain embodiments of the silica glass material of the present invention, the glass has a low level of Cl and metal contamination.

The second aspect of the present invention is directed to a method of producing silica glass material capable of being used in the light path of the lithographic irradiation of a lithographic device operating at a wavelength of below about 300 nm, comprising a step of treating the glass material in a hydrogen-containing atmosphere such that at the end of the treatment a hydrogen concentration gradient and a refractive index gradient δn at about 193 nm exist through the depth of the material, and δn is within the acceptable range for the intended use.

According to certain embodiments of the second aspect of the present invention, δn, measured at about 193 nm, satisfies the following relationship: 0≦δn≦5 ppm, in certain embodiments advantageously 0≦δn≦1 ppm, in certain embodiments advantageously 0≦δn≦0.5 ppm, in certain embodiments advantageously 0≦δn≦0.1 ppm.

In certain embodiments of the second aspect of the present invention, during the hydrogen treatment process, the partial pressure of hydrogen in the hydrogen-containing atmosphere remains essentially constant.

In certain embodiments of the second aspect of the present invention, during the hydrogen treatment process, the partial pressure of hydrogen in the hydrogen-containing atmosphere is less than about 50 atm, in certain embodiments less than about 10 atm, in certain embodiments less than about 5 atm, in certain embodiments less than about 1 atm.

In certain embodiments of the second aspect of the present invention, at the end of the hydrogen treatment process, the lowest hydrogen concentration in the material ([$H_2$](min)) and the highest hydrogen concentration in the material ([$H_2$](max)) satisfy the following relationship:

0.1≦[$H_2$](min)/[$H_2$](max)≦0.7; in certain embodiments 0.1≦[$H_2$](min)/[$H_2$](max)≦0.6; in certain embodiments 0.1≦[$H_2$](min)/[$H_2$](max)≦0.5; in certain embodiments 0.1≦[$H_2$](min)/[$H_2$](max)≦0.4;

in certain embodiments 0.2≦[$H_2$](min)/[$H_2$](max)≦0.7; in certain embodiments 0.2≦[$H_2$](min)/[$H_2$](max)≦0.6; in certain embodiments 0.2≦[$H_2$](min)/[$H_2$](max)≦0.5; in certain embodiments 0.2≦[$H_2$](min)/[$H_2$](max)≦0.4.

In certain embodiments of the second aspect of the present invention, the silica glass material prior to being treated in the hydrogen-containing atmosphere comprises hydrogen at a concentration below about $1\times10^{16}$ molecules/$cm^3$.

In certain embodiments of the second aspect of the present invention, at the end of treating the silica glass material in the hydrogen-containing atmosphere, the highest hydrogen concentration in the material is less than about $2\times10^{18}$ molecules/$cm^3$, in certain embodiments less than about $8\times10^{17}$ molecules/$cm^3$, in certain embodiments less than about $4\times10^{17}$ molecules/$cm^3$, in certain embodiments less than about $2\times10^{17}$ molecules/$cm^3$, in certain embodiments less than about $1\times10^{17}$ molecules/$cm^3$.

In certain embodiments of the second aspect of the present invention, the temperature at which the silica glass material is treated in the hydrogen-containing atmosphere is about 1000° C. or lower, in certain embodiments 800° C. or lower, in certain embodiments 650° C. or lower, in certain embodiments 600° C. or lower, in certain embodiments 500° C. or lower.

In certain embodiments of the second aspect of the present invention, during the process of treating the silica glass material in the hydrogen-containing atmosphere, at least part of the surface of the material is shielded with a hydrogen diffusion barrier such that hydrogen molecules are allowed to enter into the body of the glass material only through selected surface areas.

In certain embodiments of the second aspect of the present invention, during the process of treating the silica glass in the hydrogen-containing atmosphere, the partial pressure of hydrogen is varied.

In certain embodiments of the second aspect of the present invention, during the process of treating the silica glass in the hydrogen-containing atmosphere, the partial pressure of hydrogen is varied and set at the maximum during the initial loading stage.

In certain embodiments of the second aspect of the present invention, during the process of treating the silica glass in the hydrogen-containing atmosphere, the partial pressure of hydrogen was set to essentially zero during a certain period thereof.

In certain embodiments of the second aspect of the present invention, during the process of treating the silica glass in the hydrogen-containing atmosphere, the partial pressure of hydrogen is varied and the maximal partial pressure thereof is set to below about 5 atm, in certain embodiments below about 3 atm, in certain embodiments equal to or below about 1 atm.

In certain embodiments of the second aspect of the present invention, during the process of treating the silica glass in the hydrogen-containing atmosphere, the partial pressure of hydrogen is varied and the maximal partial pressure thereof is set to below about 5 times, in certain embodiments below about 3 times, in certain embodiments below about 2 times, of the equilibrium pressure corresponding to the highest $H_2$ concentration in the glass at the end of the hydrogen treatment.

In certain embodiments of the second aspect of the present invention, at the end of the hydrogen treatment process, the lowest hydrogen concentration in the material ([$H_2$](min)) and the highest hydrogen concentration in the material ([$H_2$](max)) satisfy the following relationship:

0.2≦[$H_2$](min)/[$H_2$](max)≦0.7; in certain embodiments 0.2≦[$H_2$](min)/[$H_2$](max)≦0.6; in certain embodiments 0.2≦[$H_2$](min)/[$H_2$](max)≦0.5; in certain embodiments 0.2≦[$H_2$](min)/[$H_2$](max)≦0.4.

In certain embodiments of the second aspect of the present invention, at the end of the hydrogen treatment process, the lowest hydrogen concentration in the material ([$H_2$](min)) and the highest hydrogen concentration in the material ([$H_2$](max)) satisfy the following relationship:

0.4≦[$H_2$](min)/[$H_2$](max)≦0.95; in certain embodiments 0.5≦[$H_2$](min)/[$H_2$](max)≦0.9; in certain embodiments $0.6 \leq [H_2](min)/[H_2](max) \leq 0.9$; in certain embodiments $0.7 \leq [H_2](min)/[H_2](max) \leq 0.9$.

In certain embodiments of the second aspect of the present invention, the silica glass material prior to being treated in the hydrogen-containing atmosphere comprises hydrogen at a concentration below about $1 \times 10^{16}$ molecules/cm$^3$.

In certain embodiments of the second aspect of the present invention, at the end of treating the silica glass material in the hydrogen-containing atmosphere, the highest hydrogen concentration in the material is less than about $8 \times 10^{17}$ molecules/cm$^3$, in certain embodiments less than about $4 \times 10^{17}$ molecules/cm$^3$, in certain embodiments less than about $2 \times 10^{17}$ molecules/cm$^3$, in certain embodiments less than about $1 \times 10^{17}$ molecules/cm$^3$.

In certain embodiments of the second aspect of the present invention, the temperature at which the silica glass material is treated in the hydrogen-containing atmosphere is about 1000° C. or lower, in certain embodiments 800° C. or lower, in certain embodiments 650° C. or lower, in certain embodiments 600° C. or lower, in certain embodiments 500° C. or lower.

In certain embodiments of the second aspect of the present invention, during the process of treating the silica glass material in the hydrogen-containing atmosphere, at least part of the surface of the material is shielded with a hydrogen diffusion barrier such that hydrogen molecules are allowed to enter into the body of the glass material only through selected surface areas.

A third aspect of the present invention is directed to a method of producing silica glass material having an average hydrogen concentration $[H_2](avg)$, a maximal hydrogen concentration $[H_2](max)$ and a minimal hydrogen concentration $[H_2](min)$, the material being capable of being used in the light path of the lithographic irradiation of a lithographic device operating at a wavelength of below about 300 nm, comprising the following steps:

(I) providing a silica soot preform comprising a plurality of silica soot particles;

(II) treating the silica soot preform in an oxygen-containing atmosphere;

(III) consolidating the silica soot preform to dense glass; and (IV) treating the consolidated silica glass in a hydrogen-containing atmosphere with varied hydrogen partial pressure, wherein a hydrogen partial pressure higher than the equilibrium hydrogen partial pressure corresponding to $[H_2](max)$ is employed during the initial loading stage of this step (IV) such that the —O—O— bonds and O$_2$ molecules in the glass are quickly consumed to a level lower than about $1 \times 10^{15}$ molecules/cm$^3$.

In certain embodiments of the third aspect of the present invention, in step (IV), the maximal hydrogen partial pressure is employed during the initial loading stage of step (IV).

In certain embodiments of the third aspect of the present invention, in step (IV), the partial pressure of hydrogen was set to essentially zero during a certain period thereof.

In certain embodiments of the third aspect of the present invention, during step (IV), the maximal hydrogen partial pressure is set to below about 5 atm, in certain embodiments below about 3 atm, in certain embodiments equal to or below about 1 atm.

In certain embodiments of the third aspect of the present invention, at the end of the hydrogen treatment process, the lowest hydrogen concentration in the material ($[H_2](min)$) and the highest hydrogen concentration in the material ($[H_2](max)$) satisfy the following relationship:

$0.2 \leq [H_2](min)/[H_2](max) \leq 0.7$; in certain embodiments $0.2 \leq [H_2](min)/[H_2](max) \leq 0.6$; in certain embodiments $0.2 \leq [H_2](min)/[H_2](max) \leq 0.5$; in certain embodiments $0.2 \leq [H_2](min)/[H_2](max) \leq 0.4$.

In certain embodiments of the third aspect of the present invention, at the end of the hydrogen treatment process, the lowest hydrogen concentration in the material ($[H_2](min)$) and the highest hydrogen concentration in the material ($[H_2](max)$) satisfy the following relationship:

$0.4 \leq [H_2](min)/[H_2](max) \leq 0.95$; in certain embodiments $0.5 \leq [H_2](min)/[H_2](max) \leq 0.9$; in certain embodiments $0.6 \leq [H_2](min)/[H_2](max) \leq 0.9$; in certain embodiments $0.7 \leq [H_2](min)/[H_2](max) \leq 0.9$.

In certain embodiments of the third aspect of the present invention, the silica glass material prior to treating in the hydrogen-containing atmosphere comprises hydrogen at a concentration below about $1 \times 10^{16}$ molecules/cm$^3$.

In certain embodiments of the third aspect of the present invention, at the end of treating the silica glass material in the hydrogen-containing atmosphere, the highest hydrogen concentration in the material is less than about $8 \times 10^{17}$ molecules/cm$^3$, in certain embodiments less than about $4 \times 10^{17}$ molecules/cm$^3$, in certain embodiments less than about $2 \times 10^{17}$ molecules/cm$^3$, in certain embodiments less than about $1 \times 10^{17}$ molecules/cm$^3$.

In certain embodiments of the third aspect of the present invention, the temperature at which the silica glass material is treated in the hydrogen-containing atmosphere is about 1000° C. or lower, in certain embodiments 800° C. or lower, in certain embodiments 650° C. or lower, in certain embodiments 600° C. or lower, in certain embodiments 500° C. or lower.

In certain embodiments of the third aspect of the present invention, during the process of treating the silica glass material in the hydrogen-containing atmosphere, at least part of the surface of the material is shielded with a hydrogen diffusion barrier such that hydrogen molecules are allowed to enter into the body of the glass material only through selected surface areas.

The present invention has the advantages of being capable of producing H$_2$-loaded silica glass material suitable for use as refractive elements of lithographic applications operating at below about 300 nm, such as at about 248 nm and 193 nm, at a speed much faster than conventional method. The silica glass material thus produced can have a low LIWFD, low induced absorption, low FDT, low refractive index variation, low induced birefringence and birefringence variation, at about 193 nm.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitute a part of this specification.

DETAILED DESCRIPTION OF THE INVENTION

Figure 1:
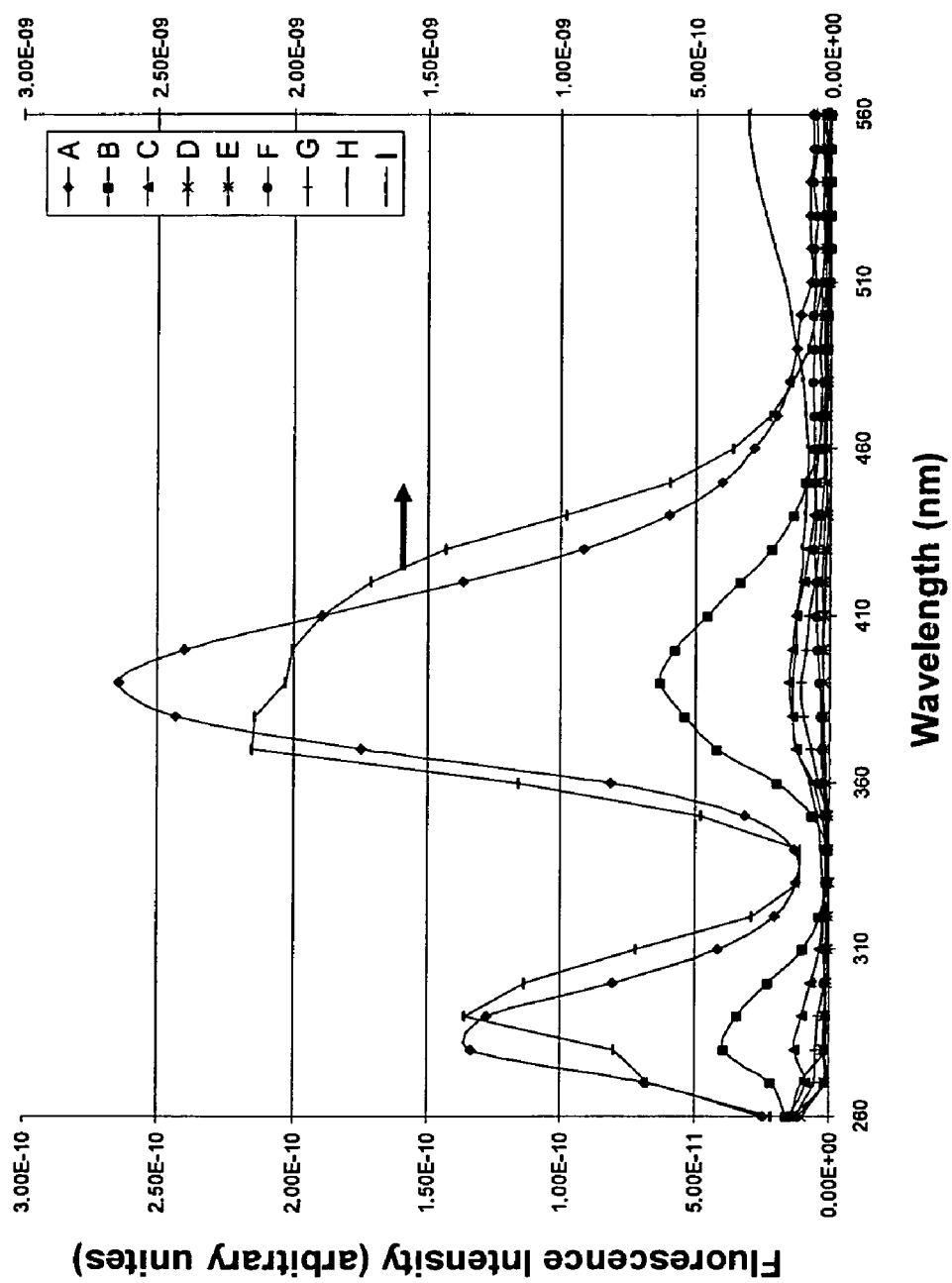
FIG. 1 is a diagram showing the fluorescence spectra of a plurality of silica glass hydrogen loaded at various temperatures.

The description above and below are given in the context of silica glass that comprise OH and doped with $H_2$. It should be understood that the invention can be applied, mutatis mutandis, to: (i) silica glasses doped with OD (i.e., glasses in which [OD]/([OD]+[OH]) is higher than the natural abundance of D, where D is deuterium ($_1^2$D) and H is hydrogen ($_1^1$H) and (ii) silica glass doped with $D_2$ and HD (i.e., glasses in which ([$D_2$]+[HD])/([$D_2$]+[HD]+[$H_2$]) is higher than the natural abundance of D). It is believed that, in certain embodiments, it is preferred that OD-doped silica glass is doped with $D_2$ instead of $H_2$ and/or HD, especially where the hydrogen loading is to be conducted at an elevated temperature, due to the increased exchange rate between OD and $H_2$.

Unless otherwise provided, in the present application, the term "hydrogen" and $H_2$ is meant to include $H_2$, $D_2$ and HD. Thus, unless specified, [$H_2$] in the present application is the sum total of [$H_2$]+[$D_2$]+[HD] in the glass.

Unless otherwise specified, in the present application, the term OH, when discussed as a dopant in a silica glass material, is meant to include both OH and OD in the glass. Thus, unless specified, [OH] in the present application is the sum total of [OH]+[OD] in the silica glass.

By "capable of being used in the light path of the lithographic irradiation of a lithographic device operating at a wavelength below about 300 nm," it is meant that:

(i) The material can be used in the light path of the lithographic irradiation while the lithographic device is being operated during the normal use for the intended function, i.e., performing lithography function in, e.g., the process of making semiconductor devices;

(ii) The material can be used in the light path for the purpose of re-directing or manipulating the lithographic irradiation.

One of ordinary skill in the art of lithography understands that for a material to be capable of being used in the light path of the lithographic irradiation of a lithographic device operating at a certain wavelength, the material should have the required composition and properties, such as internal transmission, laser induced wavefront distortion, induced absorption, and the like. One of ordinary skill in the art of lithography also understands that it is generally desired that the materials can be made at a reasonably low cost to the manufacturer and to the society at large (thus lower negative environmental impact if possible).

Typically, to be capable of being used in the light path of the lithographic irradiation of a lithographic device operating at a wavelength of below about 300 nm, the silica glass is desired to have an internal transmission at about 248 nm of at least 99.00%/cm. It is highly desired, in certain applications, especially lithographic applications for making semiconductor chips operating at about 193 nm, the silica glass has an internal transmission of at least 99.00% at about 193 nm.

Typically, to be capable of being used in the light path of the lithographic irradiation of a lithographic device operating at a wavelength of below about 300 nm, the silica glass is desired to have a sodium concentration of lower than about 100 ppm by weight, in certain embodiments lower than about 50 ppm, in certain other embodiments lower than about 10 ppm. To be capable of being used in the in light path of lithographic irradiation of a lithographic device operating at a wavelength of below about 300 nm, such as at about 248 nm or about 193 nm, it is desired that the silica glass has a sodium concentration of lower than about 500 ppb by weight, in certain embodiments lower than about 100 ppb, in certain embodiments lower than about 50 ppb, in certain other embodiments lower than about 10 ppb.

Light-induced wavefront distortion (LIWFD) as a phenomenon has been extensively studied in the prior art. It describes the wavefront distortion behavior of materials such as silica upon prolonged exposure to certain light irradiation (such as excimer laser operating in the deep UV and vacuum UV ranges). As used herein, the term "low LIWFD" at about 193 nm means that the silica glass material exhibits a LIWFD measured at 633 nm between −1.0 and 1.0 nm/cm when subjected to 10 billion pulses of a laser at approximately 193 nm operating at a fluence of approximately 70 μJ/cm², preferably between −0.1 and 1.0 nm/cm, and pulse length of about 25 ns.

As used herein, the term "induced absorption" means the absolute value of the difference in internal transmission per centimeter of the glass upon exposure to the light irradiation. Of particular interest if the induced absorption at about 193 nm, which means the induced absorption at 193 nm upon exposure to excimer laser operating at about 193 nm for 10 billion pulses at about 70 μJ/(pulse·cm²). A "low level of induced absorption" or "low induced absorption" as used herein means the induced absorption at 193 nm of lower than about 0.01/cm after about 5 billion of pulses at a fluence of about 600 μJ·cm⁻²·pulse⁻¹ and a pulse length of about 25 ns. At this dosage of exposure, the silica glass of certain embodiments of the present invention has an induced absorption of less than about 0.005/cm. The induced absorption value of the present application corresponds to the $k_i$ of the following equation (Beer's Law):

$$I_L = I_0 \cdot 10^{(k_0 + k_i)L}.$$

Fluence-dependent-transmission (FDT) of silica glass was discussed in copending, co-assigned U.S. patent application Ser. No. 11/261,005, entitled "SYNTHETIC SILICA MATERIAL WITH LOW FLUENCE-DEPENDENT-TRANSMISSION AND METHOD OF MAKING THE SAME," and filed on Oct. 28, 2005, the content of which is incorporated herein by reference in its entirety. As mentioned in this copending application, it was observed that transient absorption of synthetic silica glass (K) in the UV region is dependent on the fluence (F, expressed in terms of mJ/cm²·pulse) of the UV irradiation the glass is exposed to. The relationship between the transient absorption of the glass and radiation fluence can generally be represented by a least-squares linear fitting curve of the measured absorption and fluence data. Thus, as used herein, fluence-dependent transmission (FDT) is defined as the slope of the linear fitting curve (dK/dF). Of great interest for silica glass is its FDT at UV wavelengths at which the glass typically finds application, such as about 248 nm and 193 nm. In the present application, FDT is measured by exposing silica glass to UV excimer laser pulses at about 193 nm. The fluence of measuring UV radiation is from 1 mJ/cm²·pulse to about 10 mJ/cm²·pulse. The repetition rate of the laser is around 400 Hz. Absorption (K) of the glass is calculated from the measured internal transmission ($T_i$, expressed in terms of percentage per cm) as follows:

$$K = 2 - \log T_i.$$

For example, the absorption $K_1$ of a glass having an internal transmission $T_{i,1}$ of 99.00% is calculated as follows:

$$K_1 = 2 - \log T_{i,1} = 2 - \log 99.00 = 2 - 1.996 = 0.004.$$

As used herein, the term "low FDT at about 193 nm" means that the silica glass when exposed to eximer laser at about 193 nm has a measured FDT of less than about $1.0 \times 10^{-4}$ cm·pulse/mJ using the measuring protocol as described above.

As used herein, "low birefringence" means an average birefringence of below about 5 nm/cm, in certain embodiments below about 2 nm/cm, in certain embodiments below about 1 nm/cm, in certain embodiments below about 0.5 nm/cm, in certain embodiments below about 0.1 nm/cm.

As used herein, "low birefringence variation" means a difference between the peak birefringence and minimal birefringence below about 1 nm/cm, in certain embodiments below about 0.5 nm/cm, in certain embodiments below about 0.1 nm/cm, in certain embodiments below about 0.05 nm/cm², in certain embodiments below about 0.03 nm/cm, in certain embodiments below about 0.01 nm/cm.

As used herein, "low level of oxygen" or "low oxygen concentration" in the glass means that the oxygen concentration as measured in the silica glass is less than about $1 \times 10^{15}$ molecules/cm³. Oxygen concentration is measured by using Raman spectrophotometer as described, for example, in L. Skuja et al. Quantitative analysis of the concentration of interstitial $O_2$ molecules in $SiO_2$ glass using luminescence and Raman Spectrometry, *Journal of Applied Physics*, Volume 83, Number 11 (1 Jun. 1998).

As used herein, "initial loading stage" means the first ¼ of the hydrogen loading process in terms of time.

It has been reported in the prior art the post loading of hydrogen into a hydrogen-deficient silica glass material is necessary in order to obtain desired optical performance of the material in terms of LIWFD, induced absorption, birefringence, FDT and the like, as discussed supra. However, due to the scant teachings in the prior art of the relationship between the hydrogen level and desired optical performances of the glass for use particularly at about 193 nm, and the lack of understanding of acceptable levels of hydrogen concentrations in such glass materials, the development of an efficient and effective hydrogen loading process requires significant fundamental research work. The present inventors, having conducted extensive and systematic study detailed infra, gained an in-depth understanding of the mechanism of hydrogen loading, and accordingly devised practical hydrogen loading processes that can be implemented at significantly shorter period to result in totally acceptable optical performance for, inter alia, lithography applications operating at about 193 nm.

Post loading of glass with hydrogen is a diffusion based process and is therefore time, temperature and geometry dependent. It is known that at a given, constant partial pressure of $H_2$ at a given loading temperature, when $H_2$ diffusion reaches equilibrium, the $H_2$ concentration in the silica glass should be essentially homogeneous. The equilibrium $[H_2]$ is the highest $[H_2]$ attainable in the glass under that particular $H_2$ partial pressure and constant loading temperature. For the convenience of discussion, it is assumed in the present application that the very surface of the glass material reaches equilibrium in a very short period of time. As used herein, the "equilibrium pressure corresponding to the highest $H_2$ concentration in the glass at the end of the hydrogen treatment"

means the equilibrium constant $H_2$ partial pressure required for obtaining the highest $[H_2]$ at the end of the hydrogen loading process in the silica glass at the end of the hydrogen loading process.

TABLE I shows the time needed to hydrogen load fused silica glass at various temperatures for various thicknesses of glass where the thickness of the part is much less than the diameter of the part, so that a 1D diffusion calculation can be used. The data in this table were calculated assuming that the center concentration is 90% that at the surfaces of the part for a planar geometry. In this table, possible reactions of $H_2$ with the glass (such as with any interstitial $O_2$ present and with the $SiO_2$ network) are ignored.

TABLE I

| Thickness of sample (mm) | Loading time needed at various temperatures (days) | | | |
| --- | --- | --- | --- | --- |
| | 500° C. | 650° C. | 800° C. | 1000° C. |
| 30 | 45 | 15 | 7 | 3 |
| 45 | 97 | 32 | 15 | 7 |
| 60 | 169 | 56 | 26 | 12 |
| 100 | 439 | 146 | 66 | 31 |

The times needed to hydrogen load range from 3 days for thinner parts at higher temperatures to over a year for low temperature parts that are thick. The data in the table would suggest that $H_2$ loading should then be done at high temperatures which will greatly reduce the hydrogen loading times. However, the disadvantage of using higher temperatures is the degradation of laser damage performance including increased fluorescence; degraded Fluence Dependent Transmission (FDT) and changes in the laser induced wavefront distortion. FIG. 1 clearly shows increased fluorescence of the silica glass hydrogen loaded at higher temperatures. FIG. 1 shows fluorescence spectra of silica with different [OH] levels, $H_2$ loaded at different temperatures. Strong fluorescence bands are observed in the ~100 ppm OH glasses $H_2$ loaded at $\geq 800°$ C. (Glasses A and B) and in the glass $H_2$ loaded in consolidation (Glass I). No fluorescence is observed in $\leq 600°$ C. $H_2$ loaded glasses (Glasses D, E and F). The fluorescence bands are weak in the glass $H_2$ loaded at 700° C. (Glass C) and in the two glasses with >500 ppm OH, $H_2$ loaded at $\geq 800°$ C. (Glasses G and H). Therefore, there is an advantage in utilizing colder loading temperatures which means very long loading times by conventional means. However, long hydrogen loading time increases the turn-around time and cost of the sample. Thus there is a significant need of expediting the hydrogen loading speed and shorten the hydrogen loading time at a relatively low loading temperature.

A. Determining Acceptable Hydrogen Loading Concentrations

Figure 2:
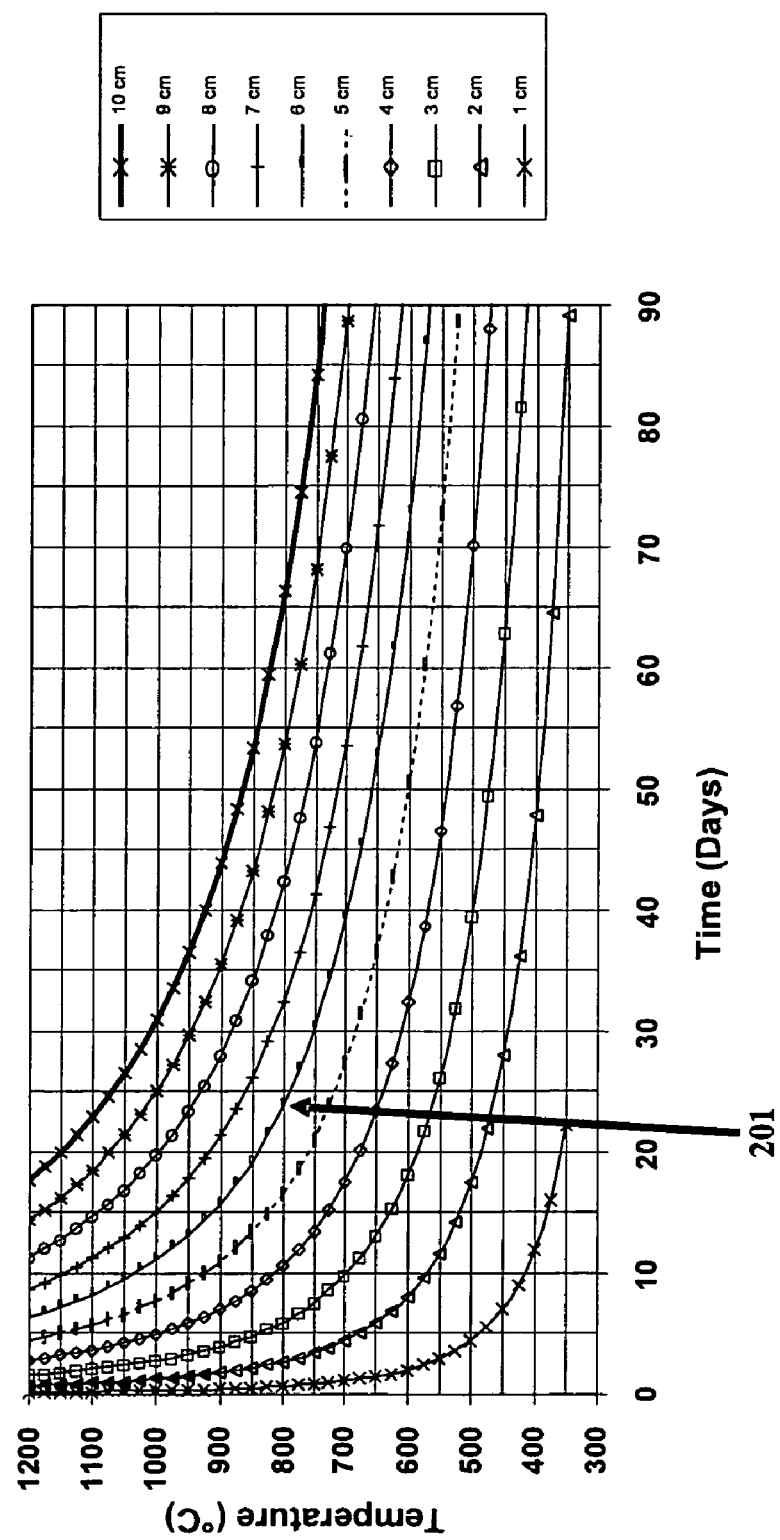
FIG. 2 is a diagram showing the loading time—loading temperature relationship of a series of silica glass samples having various thickness for the samples to achieve a center $H_2$ concentration about 90% of the surface $H_2$ concentration.
Figure 3:
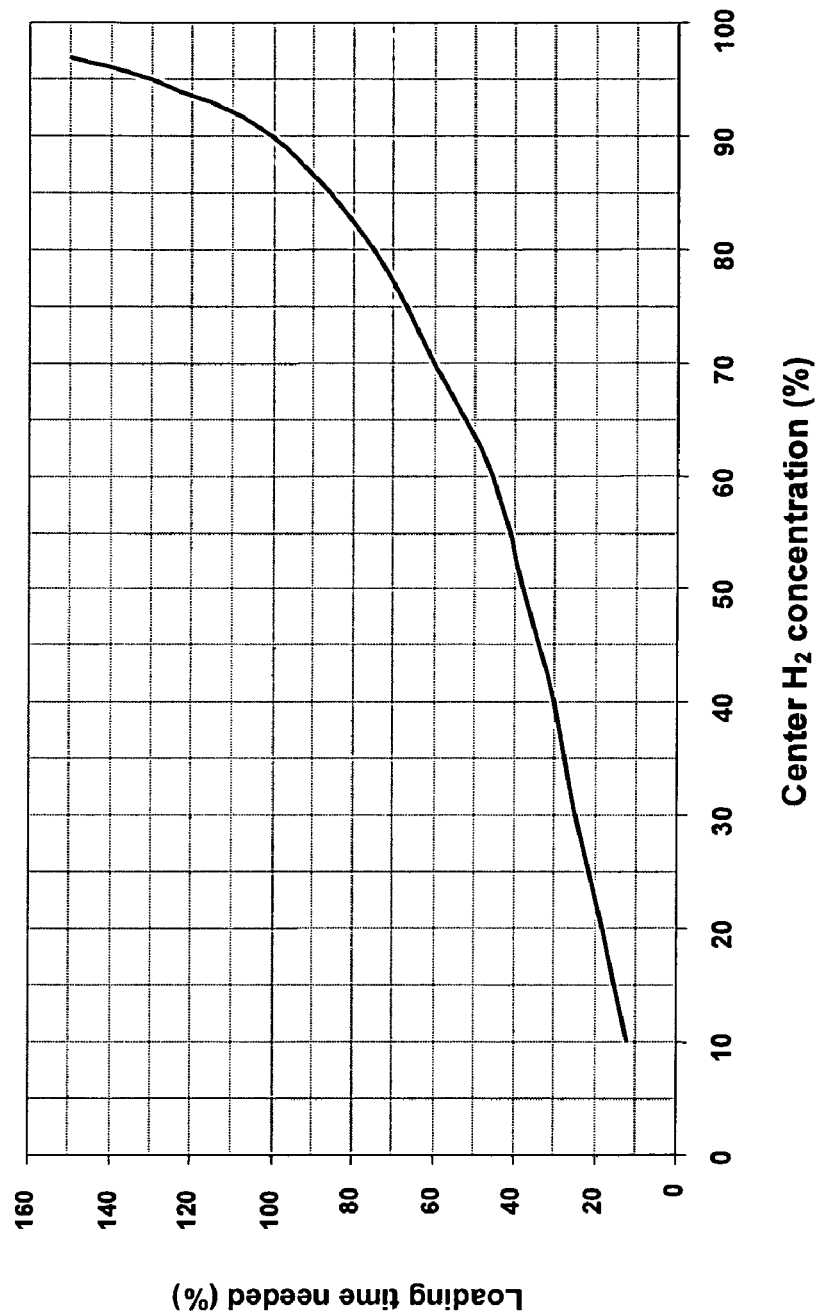
FIG. 3 is a diagram showing the loading time needed for a particular sample to achieve differing center $H_2$ concentration relative to the surface $H_2$ concentration.

Conventional hydrogen loading conditions assume that a uniform hydrogen concentration is needed throughout the glass part. It involves placing the glass in an atmosphere containing hydrogen and heating the part for a long enough time to allow an almost uniform distribution of hydrogen throughout the part. However, the present inventors have found that hydrogen concentration gradients in the glass may be acceptable and it could allow for significant reduction in loading times: One particular embodiment of the process of the present invention involves the use of a constant partial pressure of hydrogen atmosphere in which the part is placed. FIG. 2 is a plot of hydrogen loading times as a function of temperature and part thickness for conventional hydrogen loading conditions. For this case, "conventional" is defined as having no more than 10% difference in hydrogen concentration throughout the part. In this figure, 201 is a specific example showing that for a 6 cm thick part, in order to obtain a 90% concentration at the part center at 800° C. $H_2$ loading temperature, approximately 24 days would be required. FIG. 3 shows that the hydrogen loading time can be significantly reduced if hydrogen gradients greater than 10% are acceptable. Shown on the horizontal axis is the hydrogen concentration in the center of the part compared to saturation (i.e., the surface concentration), and on the vertical axis is the loading time needed expressed in terms of percentage of the time required for the center concentration to reach 90% of the saturation concentration (the conventional loading requirement). Thus, as an example shown in the curve of FIG. 3, the time required to load to 30% of the saturation concentration is merely 25% of the time required to load to 90% of the saturation concentration at the center of the part. Thus, if this gradient (100% at the surface and about 30% at the center of the part) is acceptable, about 75% of loading time can be saved compared to the conventional loading scheme which requires a center concentration about 90% of the surface concentration.

Figure 4:
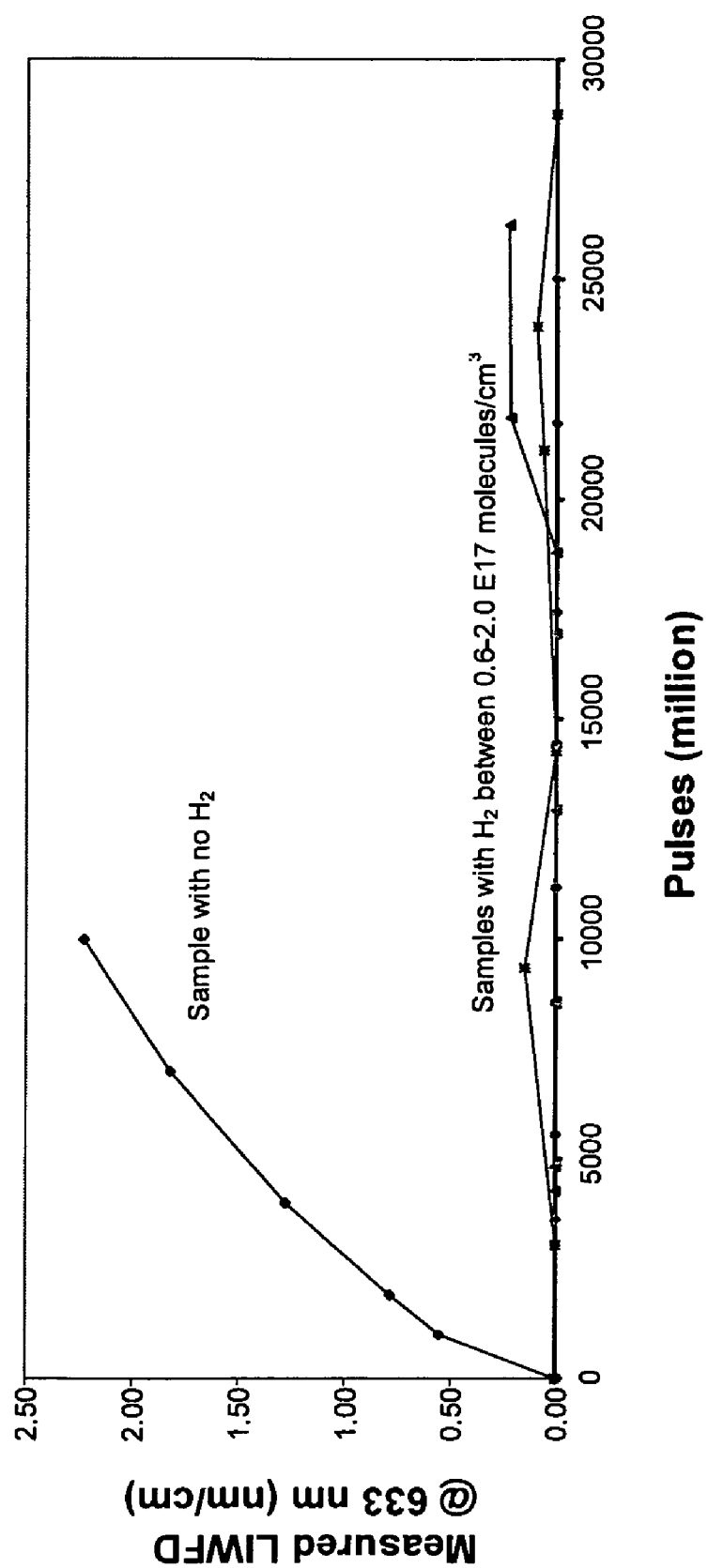
FIG. 4 is a diagram showing the LIWFD behavior of a series of silica glass without doped $H_2$ and with different doped $H_2$ levels as a function of number of laser pulses when the glass samples are exposed to excimer laser at about 193 nm.

Various hydrogen concentrations will be acceptable if both the impact to index of refraction is acceptable and also the laser damage behavior is acceptable for the various hydrogen levels found throughout the clear aperture of the part. To explore to what extent the hydrogen gradient can be tolerated for the UV lithography applications, especially UV lithography in the deep and vacuum UV regions, such as at about 248 nm and 193 nm, the present inventors set out to investigate the impact of the hydrogen gradient on the important optical performance parameters required of such glass.

i. Impact of $H_2$ Gradient on LIWFD $H_2$ is needed to minimize the amount of laser-induced wavefront distortion (LIWFD) compaction in silica glasses, but data shown in FIG. 4 indicates that only small levels are needed. Shown on the horizontal axis is the number of pulses of an excimer laser operating at about 193 nm and a fixed fluence and pulse length, and on the vertical axis is the LIWFD measured at about 633 nm. This figure shows that LIWFD for glasses with and without hydrogen vary dramatically. However, $H_2$ values between 0.6 and $2.0 \times 10^{17}$ molecules/cm$^3$ show no difference in LIWFD behavior for $H_2$ loading between 350° C., and 500° C. for [OH] values of nominally 100 ppm by weight.

After a minimal amount of $H_2$ is added, there is seen no difference in laser damage performance for values between 0.6 and $2 \times 10^{17}$ molecules/cm$^3$. Samples without $H_2$ loading experience much compaction compared to samples with $H_2$. This indicates that $H_2$ is needed to minimize LIWFD. Hydrogen is needed, but the data indicates that only a minimum amount is needed, after which behavior remains the same regardless of $H_2$ levels.

Figure 5:
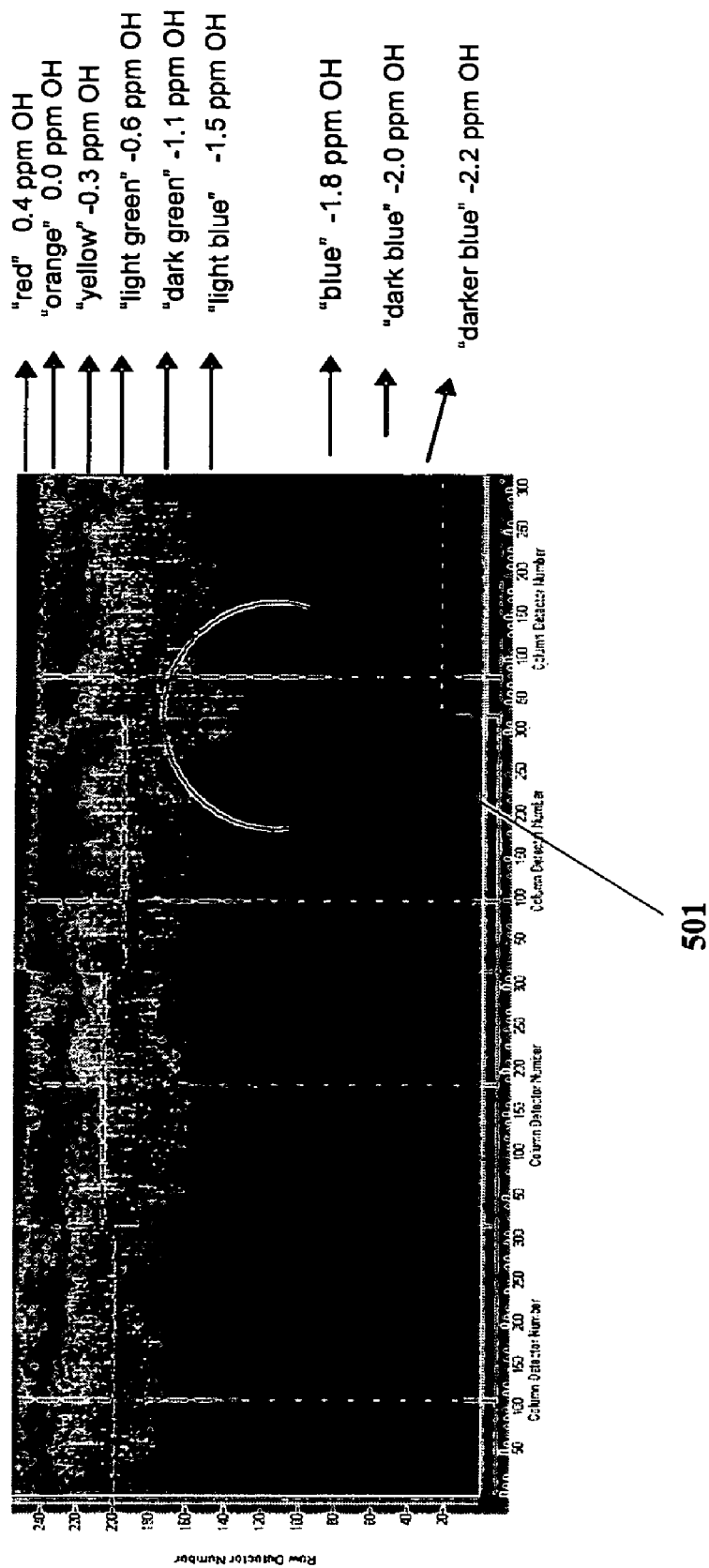
FIG. 5 is a picture showing the [OH] distribution of a silica glass sample part of which has been exposed to an excimer laser beam at about 193 nm after long exposure.

Data from these glasses also show very little hydrogen consumption upon exposure to billions of pulses from the laser as seen in FIG. 5. This figure is an [OH] array map of a silica glass sample after 30 Billion pulses at 70 μJ/(cm$^2$·pulse). This figure shows that at most only about 0.3 ppm [OH] was created during this long term exposure. TABLE II blow listed the calculated amount of $H_2$ consumed in the glass for various amounts of OH generated in the glass. This table indicates that to generate an additional [OH] of about 0.3 ppm, the $H_2$ consumed is about $1.1 \times 10^{16}$ molecules/cm$^3$. The calculation assumes the following reaction:

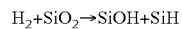

$$H_2 + SiO_2 \rightarrow SiOH + SiH$$

1 mole of $H_2$ reacts to form 1 mole of β-OH.

The amount of $H_2$ consumed is small and suggests that although $H_2$ is needed to minimize LIWFD, only a minimal amount is needed.

$H_2$ levels as low as $0.1 \times 10^{17}$ molecules/cm$^3$ are acceptable.

TABLE II

| [OH] Generated | H₂ consumed (×10¹⁷ molecules/cm³) |
| --- | --- |
| 0.3 | 0.11 |
| 0.7 | 0.25 |
| 1.0 | 0.39 |

If it is assumed that hydrogen would react with $SiO_2$ to form SiOH and SiH as shown above, then this would suggest that at most only $1 \times 10^{16}$ molecules/cm³ of hydrogen reacted. This indicates that low hydrogen levels are acceptable for minimum induced absorption (IA). Between $1 \times 10^{15}$ and $1 \times 10^{17}$ molecules/cm³ may be acceptable, although the preferred range is between $8 \times 10^{15}$ and $1 \times 10^{17}$ molecules/cm³. These low levels are also preferred in order to insure that the glass behaves in a purely compacting manner. Unpredictable LIWFD is bad and thus, low $H_2$ levels combined with low [OH] levels insure that the LIWFD will be purely compacting in nature.

To summarize, identical LIWFD is shown to occur for a wide range of $H_2$ levels. Therefore, large $H_2$ gradients are shown to be acceptable from the standpoint of the impact on LIWFD and IA.

ii. Impact of $H_2$ Gradient on Index Homogeneity

Figure 6:
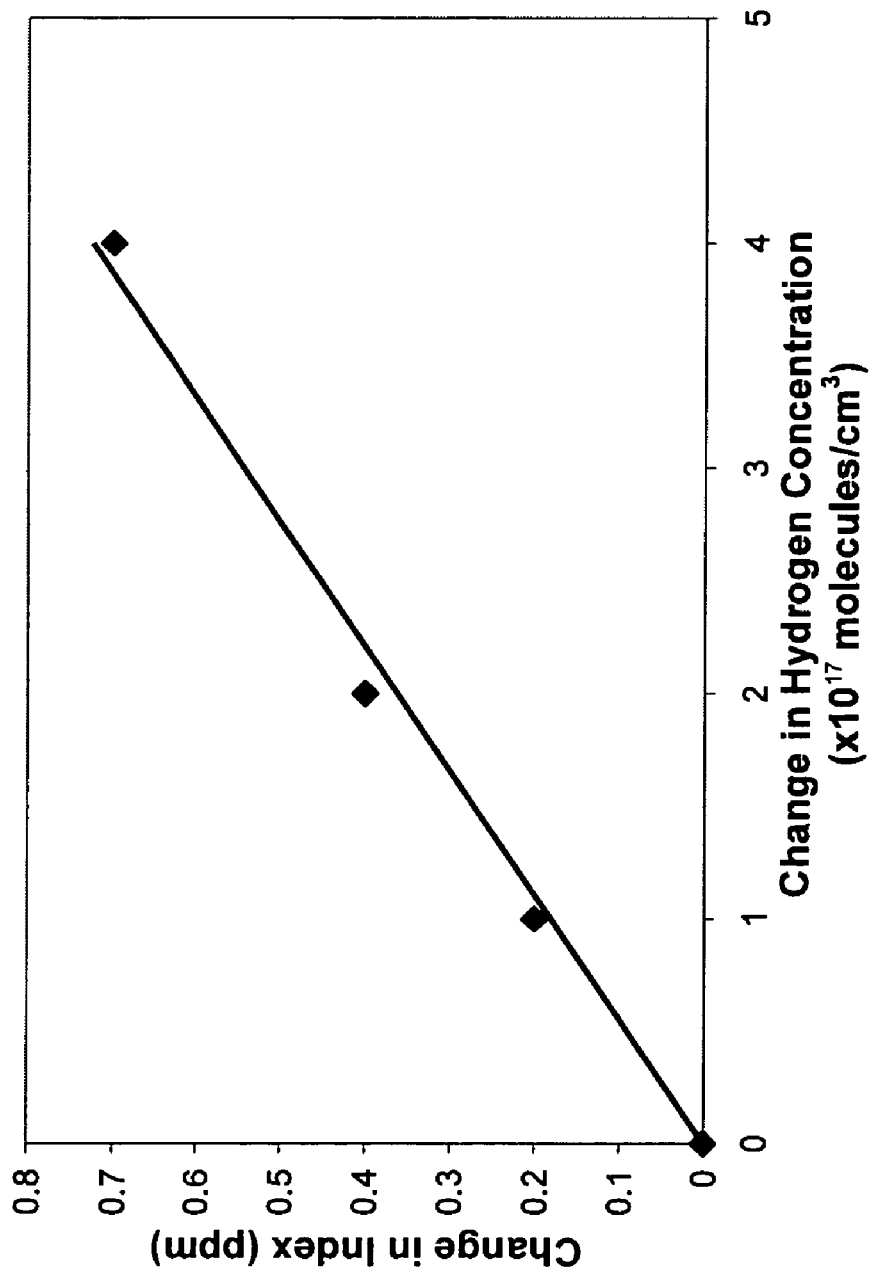
FIG. 6 is a diagram showing the relationship between the change in refractive index as a function of change in hydrogen concentration in a silica glass sample.

Experiments were conducted measuring how hydrogen results in a change in the index of refraction in fused silica glass. FIG. 6 shows that increased levels of hydrogen caused a decrease in the refractive index in samples of high-purity synthetic silica glass with nominally 1000 ppm OH. Regardless of the actual mechanism, the plot shows a near linear relationship between index of refraction and hydrogen variations. Without the intention or necessity to be bound by any particular theory, the present application discusses below how this data is used as a basis for defining acceptable hydrogen gradients.

The hydrogen levels are directly related to index variations as shown in FIG. 6 for 1000 ppm OH glass. However, it has been found that the preferred [OH] level for stepper optics is typically less than 500 ppm. Therefore, the slope of the index vs. Hydrogen may be different than that shown in FIG. 6 of a silica glass sample having [OH] less than about 500 ppm, depending on actual mechanism. For example, if the mechanism for index change is silica reacting with $H_2$, such as equation (1):

$$SiO_2 + H_2 \rightarrow SiOH + SiH \quad (1),$$

then the slope would be expected to be greater at lower [OH] levels because incremental [OH] impacts index to a greater extent as the nominal [OH] level decreases. On the other hand, if the mechanism is simply due to additional molecular $H_2$, then the impact would be independent of [OH].

In free space the lowest electronic transition in a $H_2$ molecule corresponds with 91689/cm or 11.37 eV or 109 nm. The vibrational energy in the ground state is 4395/cm or 2.28 microns. Either way these excitations are far away from 633 nm. This is not conclusive for properties of $H_2$ in glass but explains why it is hard to imagine $H_2$ floating around inside voids in silica and having much effect on optical properties. OH bonded into the silica network, on the other hand, can change the electronic orbitals that are responsible for optical response around 633 nm or 193 nm.

Calculations were made to see how loading times would be impacted in a 100 mm thick part for different index specifications. The calculations looked at index changes resulting from contributions of hydrogen only.

The calculations assumed that hydrogen impacted index 5 times more in a low [OH] glass than in a 1000 ppm OH glass, e.g., $1 \times 10^{17}$ molecules/cm³ difference in hydrogen result in 1 ppm change in index. Next, maximum index variations allowable from hydrogen contributions were set at 1, 0.5, 0.3 and 0.2 ppm. Part thickness of 100 mm was used with the results shown in FIG. 7 for maximum hydrogen levels between 0.1 and $4 \times 10^{17}$ molecules/cm³. Hydrogen loading times can be decreased significantly by both allowing an acceptable hydrogen gradient in the part and also by reducing the peak hydrogen level within the part. The minimum time is the time needed to get some hydrogen to the center. Here, the minimum time has been identified arbitrarily at 10% of maximum $H_2$ level in part. In this figure, the lower limit 701 as indicated by the dotted line is based on some minimal $H_2$ needed to prevent laser damage, but not based on index or index variation. Other loading time in this figure were calculated based on minimal index variations.

Figure 7:
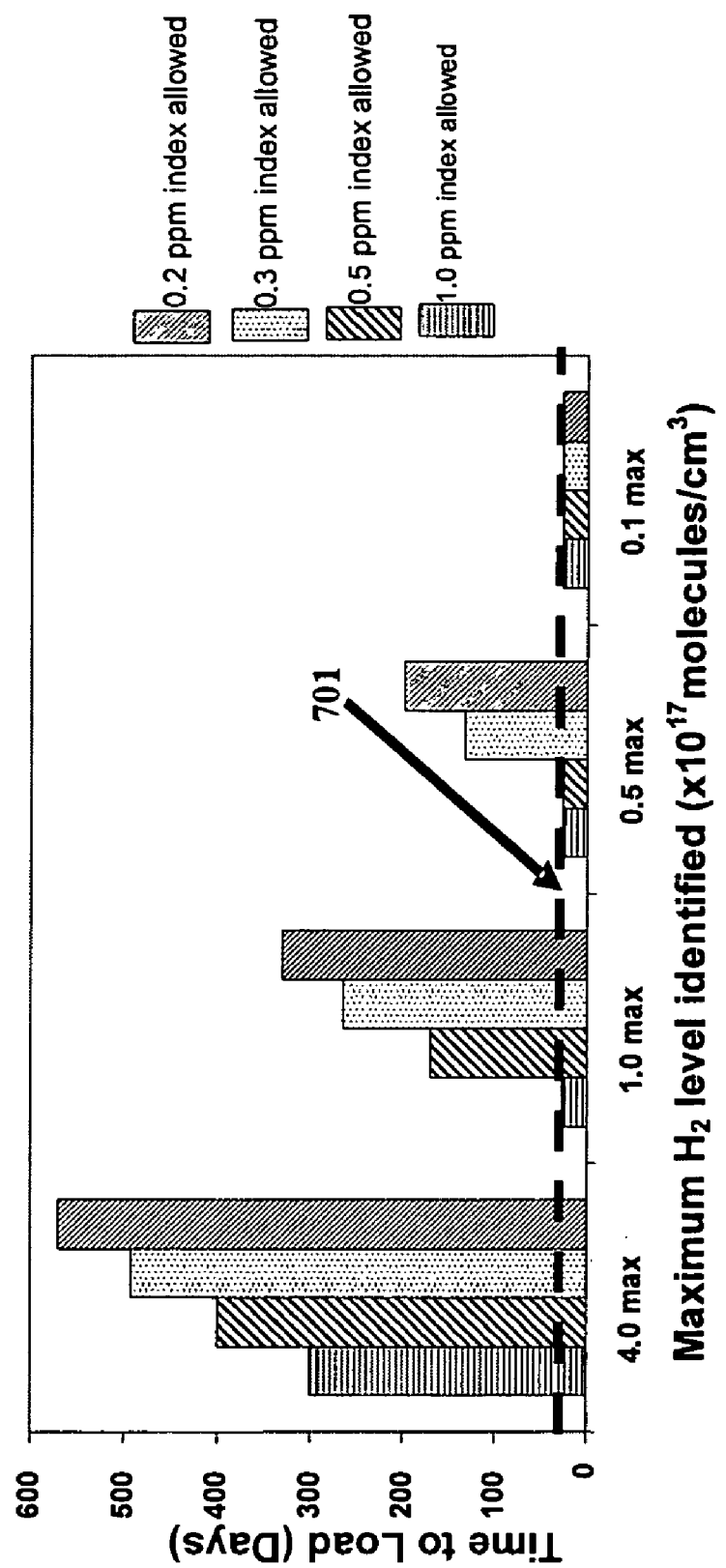
FIG. 7 is a diagram showing the relationship between the time to load as a function of maximum $H_2$ level identified in silica glass.

Several trends are obvious from the plot of FIG. 7. First, it is clear that $H_2$ loading times will decrease as the absolute hydrogen level decreases. As an example, it may take 580 days to load a 100 mm part with an index variation less than 0.2 ppm if the maximum hydrogen level is $4 \times 10^{17}$ molecules/cm³ (minimum is $3.8 \times 10^{17}$ molecules/cm³ or 95% of center). However, it will only take 220 days if the maximum level is reduced to $0.5 \times 10^{17}$ molecules/cm³ (minimum is $0.3 \times 10^{17}$ molecules/cm³ or only 60% of maximum). This is because the absolute variation in hydrogen impacts index and not the relative differences, whereas loading time is dependent strictly on relative levels. This can be seen by referring to FIG. 3 where it will take ~2.6 times longer to load a sample to 95% center ($4.0 \times 10^{17}$ molecules/cm³ sample) than to load it to 60% in the center ($0.5 \times 10^{17}$ molecules/cm³ sample).

Secondly, it can be seen that shorter loading times will have larger hydrogen variations and consequently bigger index variations. Therefore, the acceptable loading time will depend on acceptable index variations. Finally, resistance to laser damage requires some hydrogen in the sample center as previously shown in FIG. 4. Therefore, some minimum time is needed for some minimal hydrogen level to reach the center of the glass.

To summarize, hydrogen variation correlate with index variations within these glasses. Based on known diffusivities of hydrogen, known sample geometry and known correlation between hydrogen variations and index of refractions, the index of refraction in the final part is both predictable and controllable in light of the teachings of the present application.

B. Variable External Partial Pressure

This method of the present invention involves the use of varying the external partial pressure of hydrogen in order to reduce the loading time and to hydrogen load and also optionally to obtain less hydrogen variations within the part. As an example, the hydrogen cycle starts with overpressure to raise the $H_2$ level at the center as quickly as possible. As it approaches the desired level the external pressure is ramped down toward the final concentration. The schedule may then proceed to drive the external boundary conditions one or more times below or above the final concentration. Each time the external boundary condition crosses the final concentration value an additional ripple is created in the concentration profile.

The $H_2$-loaded silica glass capable of being used in the light path of lithographic irradiation of a lithographic device according to the process of the present invention constitutes a second aspect of the present invention. The silica glass of the present invention features the average $[H_2]$ and $[H_2]$ gradient as described supra. In certain embodiments, the silica glass of the present invention has the low LIWFD, low IA, low refractive index variation, low birefringence and low birefringence variation desired for lithographic applications at about 193 nm.

The present inventors have found that [$H_2$] gradient in the silica glass has a correlation between the birefringence variation in the glass. In certain embodiments, it was found that the birefringence pattern of the glass resembles the [$H_2$] profile. It is expected that, in certain embodiments of the silica glass of the present invention, with a [$H_2$] gradient of about $1\times10^{17}$ molecules/cm$^3$, the birefringence variation is lower than 0.1 nm/cm, in certain embodiments lower than about 0.05 nm/cm, in certain other embodiments lower than about 0.03 nm/cm.

Without intending to be bound by any particular theory, the present inventors believe that in silica glass materials comprising —O—O— linkages and/or $O_2$ molecules prior to hydrogen loading, such —O—O— linkages and $O_2$ molecules act as hydrogen sinks in the hydrogen loading process. The reaction between —O—O— linkages and $O_2$ with $H_2$ consumes some of the hydrogen diffused into the glass and slows down the overall loading process. Therefore, it is desired that, during the initial loading stage, such as at the beginning, of the hydrogen loading process, a high $H_2$ partial pressure is employed, such that the hydrogen sinks are quickly consumed. Thereafter, even if $H_2$ loading is conducted at a lower $H_2$ partial pressure, diffusion of $H_2$ can still proceed fast due to the lack of the impedances of the sinks.

However, in the soot-to-glass processes such as outside vapor deposition (OVD), vapor axial deposition (VAD) and inside vapor deposition (IVD), during the step when the soot preform is consolidated or sintered into transparent silica glass at an elevated temperature, it is often desired that an oxidative atmosphere containing $O_2$ or $H_2O$ is used. As a result, the consolidated glass may contain —O—O— and/or $O_2$ molecules to various extent. In those processes for making synthetic silica glass, it is desirable that the hydrogen loading process comprises a first step wherein the hydrogen partial pressure is high, or even maximum, so that the hydrogen sinks are quickly consumed and eliminated. Accordingly, one aspect of the present invention is a process for making silica glass having an average hydrogen concentration [$H_2$](avg), a maximal hydrogen concentration [$H_2$](max) and a minimal hydrogen concentration [$H_2$](min), the material being capable of being used in the light path of the lithographic irradiation of a lithographic device operating at a wavelength of below about 300 nm comprising the following steps:

(I) providing a silica soot preform comprising a plurality of silica soot particles;

(II) treating the silica soot preform in an oxygen-containing atmosphere;

(III) consolidating the silica soot preform to dense glass; and (IV) treating the consolidated silica glass in a hydrogen-containing atmosphere with varied hydrogen partial pressure, wherein a hydrogen partial pressure higher than the equilibrium hydrogen partial pressure corresponding to [$H_2$](max) is employed during the initial loading stage of this step (IV) such that the —O—O— bonds and/or $O_2$ in the glass are quickly consumed to a level lower than about $1\times10^{15}$ molecules/cm$^3$. In certain embodiments, advantageously the maximal pressure of $H_2$ is utilized during the initial loading stage, such as at the beginning, of the hydrogen treatment step.

The silica glass material of the present invention advantageously has a low level of contaminants. It has been found that Cl and metal ions such as alkaline metal ions, alkaline earth metal ions and transition metals are detrimental to the optical performance of the silica glass at deep UV and vacuum UV, such as those in terms of initial transmission, induced absorption, birefringence, laser induced birefringence, laser induced wavefront distortion, FDT, and the like. Therefore, it is highly desired that the silica glass for use in the refractive elements of lithographic devices operating in the deep UV and/or vacuum UV to have a low level of undesirable contaminants such as Cl, Li, Na, K, Rb, Be, Mg, Ca, Sr, Ba, Group 14 metals (Ge, Sn, Pb), Group 15 metals (As, Sb, Bi), transition metals, and the like. Particularly desirably, the silica glass of the present invention has a Na concentration of below about 50 ppb by weight, in certain embodiments below about 20 ppb, in certain embodiments below about 10 ppb, in certain embodiments below about 5 ppb, in certain embodiments below about 1 ppb. The silica glass of the present invention advantageously has a Cl concentration of below about 50 ppm by weight, in certain embodiments below about 30 ppm, in certain embodiments below about 10 ppm, in certain embodiments below about 5 ppm, in certain other embodiments below about 1 ppm, in certain other embodiments below about 500 ppb, in certain other embodiments below about 300 ppb. If the silica glass of the present invention comprises at least one metal M other than Na, for each and every metal M, desirably the concentration of M ([M]) is below about 100 ppb by weight, in certain embodiments [M]$\leq$10 ppb, in certain embodiments [M]$\leq$1 ppb. If the silica glass of the present invention comprises at least one metal M other than Na, in certain embodiments it is desired that for all metal M, $\Sigma$[M]$\leq$200 ppb by weight, in certain embodiments $\Sigma$[M]$\leq$100 ppb, in certain embodiments $\Sigma$[M]$\leq$50 ppb. If the silica glass of the present invention comprises Na and at least one other metal M, in certain embodiments it is desired that for all metals, $\Sigma$([Na]+[M])$\leq$200 ppb by weight, in certain embodiments $\Sigma$([Na]+[M])$\leq$100 ppb, in certain embodiments $\Sigma$([Na]+[M])$\leq$50 ppb. As used herein, by "a low level of Cl," it is meant that the glass comprises Cl at a level lower than about 10 ppm by weight; by "a low level of Na," it is meant the silica glass comprises lower than about 10 ppb by weight of Na; by "a low level of metals other than sodium," it is meant that for each metal M other than Na, the concentration of M ([M]) is below about 10 ppb by weight.

The present invention is further illustrated by the following non-limiting examples.

EXAMPLES

Example 1

Figure 8:
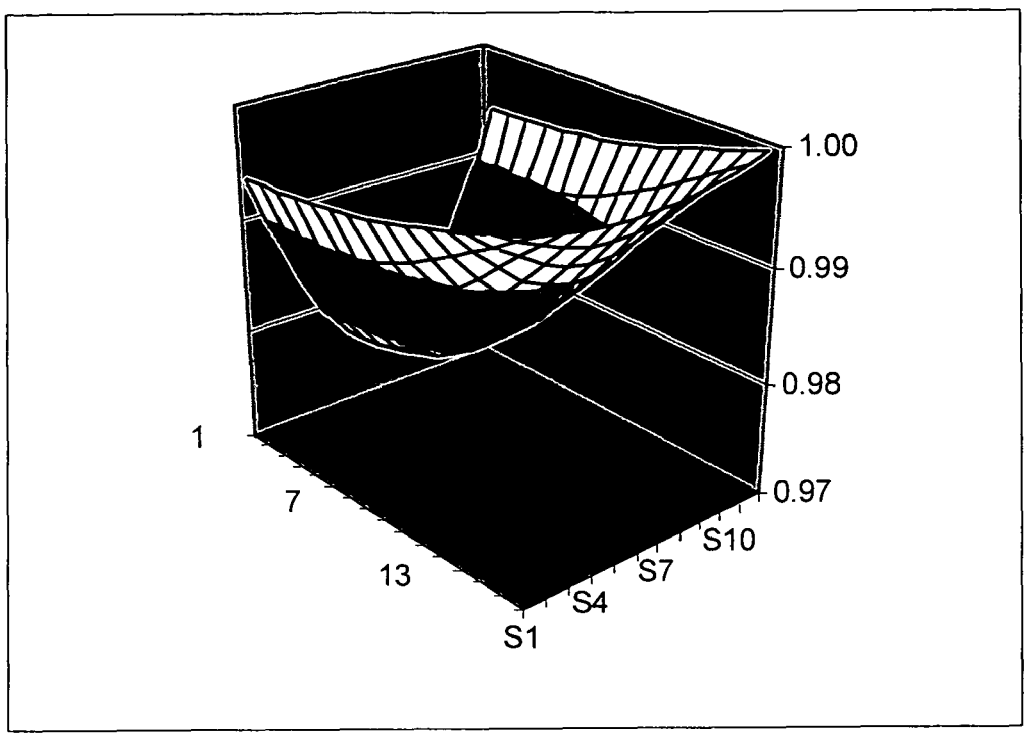
FIG. 8 is a diagram showing the $H_2$ concentration profile of a silica glass sample upon being treated in an $H_2$-containing atmosphere with a constant $H_2$ partial pressure.

Comparisons are made here between the first method of the present invention which utilizes a uniform partial pressure of hydrogen and the second method of the present invention which utilizes variable partial pressures of hydrogen. Hydrogen loading using the first method, as was discussed in section A above, results in a single minimum at the center of the lens blank. Other examples of calculated hydrogen gradients are presented in TABLE III below with one example of a hydrogen gradient shown in FIG. 8 for specific cylindrical glass geometry of 270 mm diameter×60 mm thick disc hydrogen loaded at 600° C.

TABLE III

| Loading time at full temperature | | [$H_2$] Edge | [$H_2$] Center | Max External [$H_2$] | Max Gradient |
|---|---|---|---|---|---|
| (Minutes) | (Days) | ($\times 10^{17}$ molecules/cm$^3$) | | | |
| 100,000 | 69 | 1.0 | 0.83 | 1 | 0.08 |
| 150,000 | 103 | 1.0 | 0.93 | 1 | 0.03 |
| 200,000 | 138 | 1.0 | 0.98 | 1 | 0.01 |

Example 2

This example uses the second method of the present invention (variable $H_2$ partial pressure). Likewise, it assumes loading a 270 mm×60 mm silica disk at 600° C. The parameters and results are shown in TABLE IV. TABLE IV shows that the second method of the present invention can achieve the same Δ[$H_2$] of ~0.15×10$^{17}$ molecules/cm$^3$ in around half the time needed for the first method in this particular example.

TABLE IV

| Loading time at full temperature | | [$H_2$] Max | [$H_2$] Min | Δ [$H_2$] | Max External Concentration | Max [$H_2$] Gradient |
|---|---|---|---|---|---|---|
| (Minutes) | (Days) | (×10$^{17}$ molecules/cm$^3$) | | | | |
| 50,000 | 35 | 1.25 | 0.96 | 0.29 | 5 | 0.15 |
| 50,000 | 35 | 1.04 | 0.89 | 0.15 | 8 | 0.07 |

Figure 9:
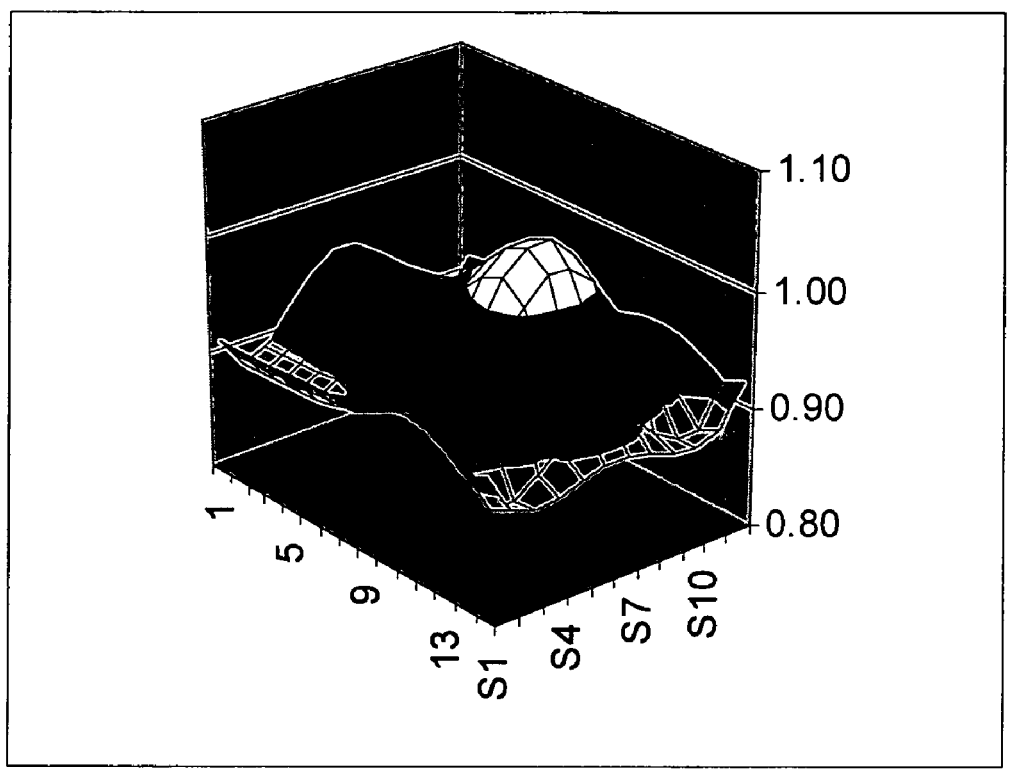
FIG. 9 is a diagram showing the $H_2$ concentration profile of a silica glass sample upon being treated in an $H_2$-containing atmosphere with varying $H_2$ partial pressure.
Figure 10:
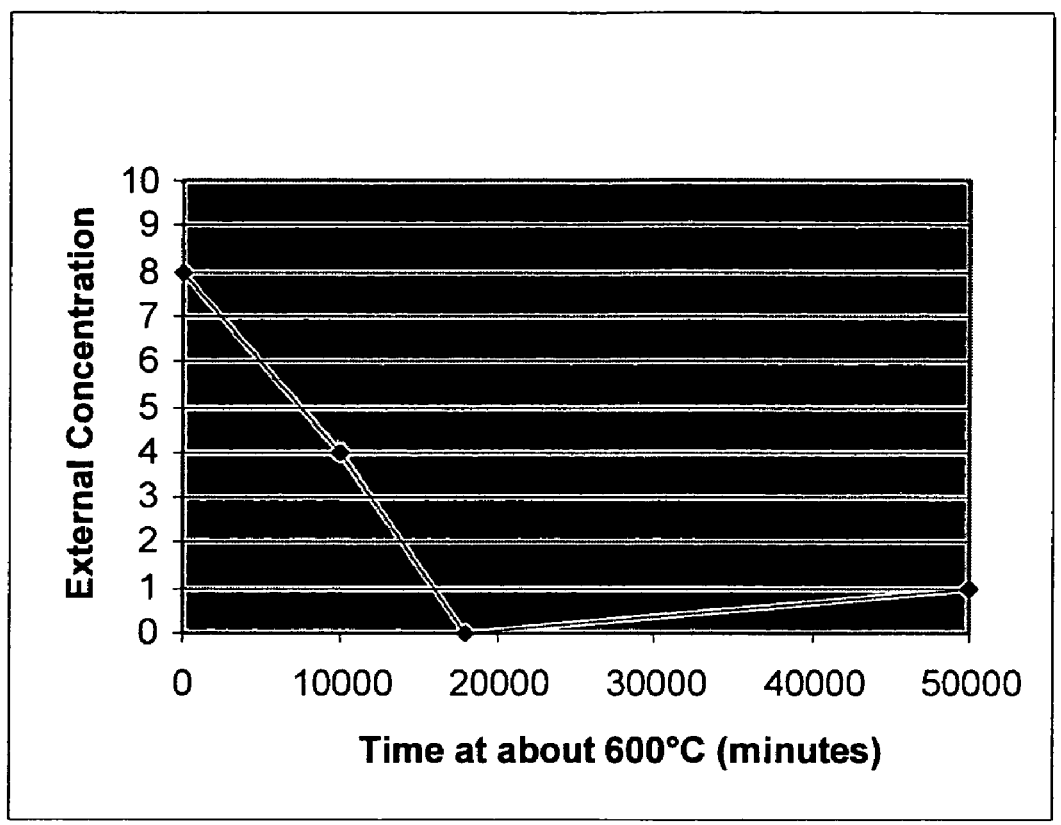
FIG. 10 is a diagram showing the $H_2$ partial pressure profile used in loading a silica glass sample according to one embodiment of the process of the present invention to result in the $H_2$ concentration profile of FIG. 9.
Figure 11:
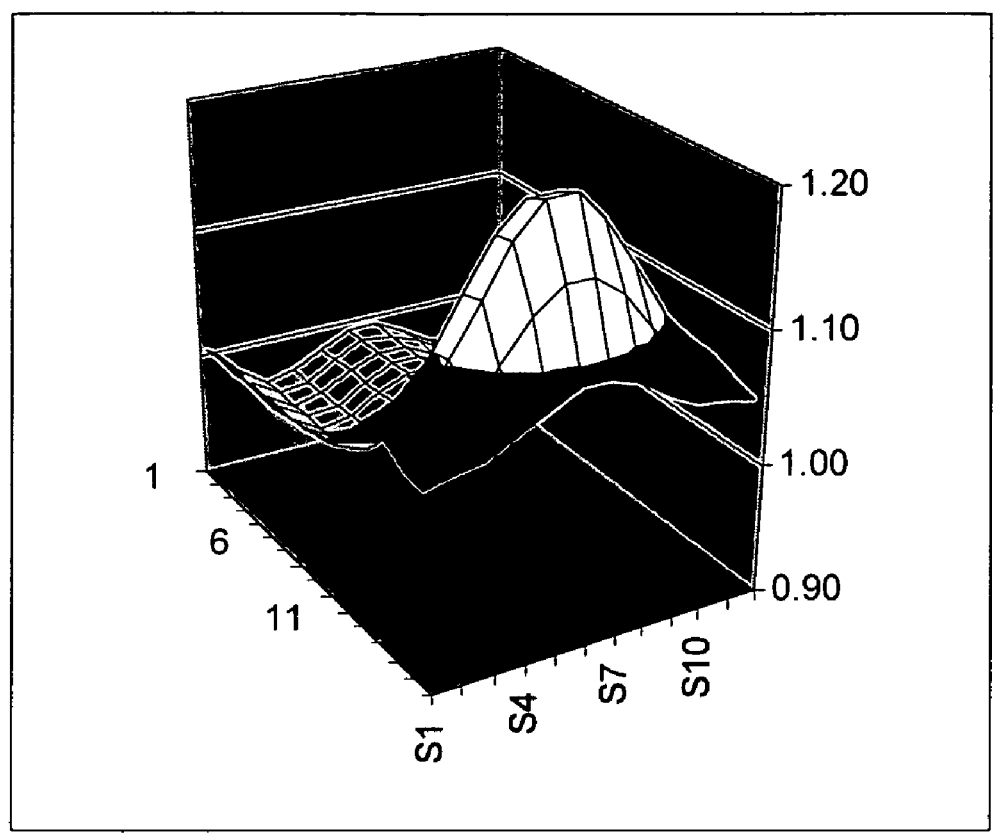
FIG. 11 is a diagram showing the $H_2$ concentration profile of a silica glass sample upon being treated in an $H_2$-containing atmosphere with varying $H_2$ partial pressure.
Figure 12:
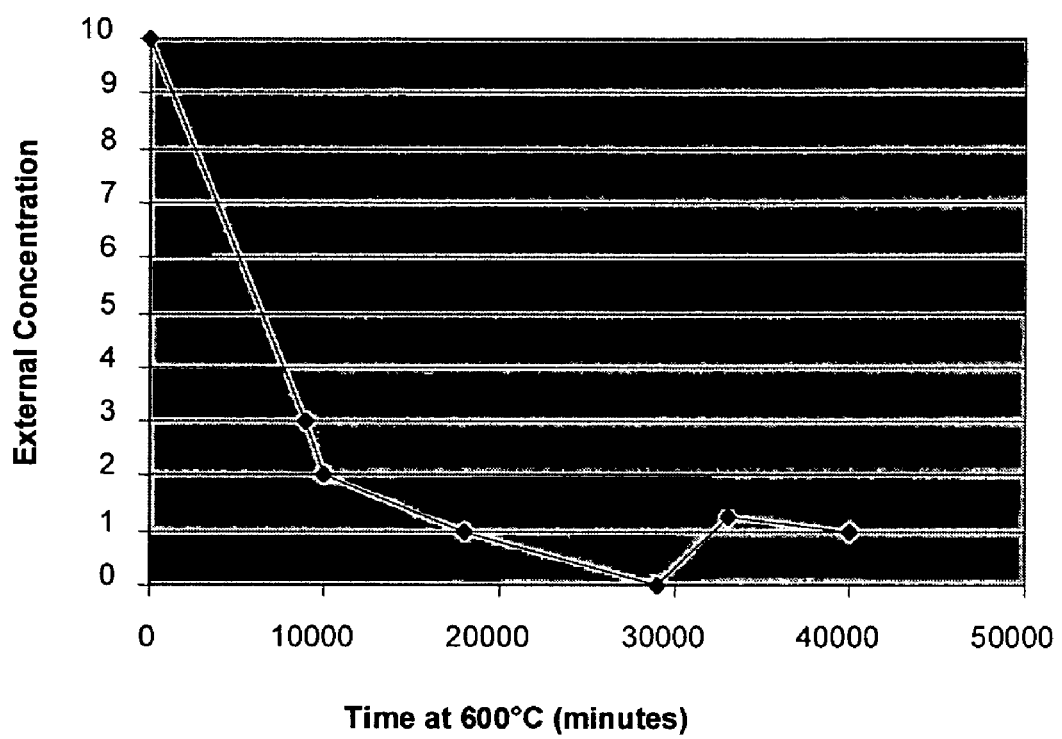
FIG. 12 is a diagram showing the $H_2$ partial pressure profile used in loading a silica glass sample according to one embodiment of the process of the present invention to result in the $H_2$ concentration profile of FIG. 11.

FIG. 9 shows an example of a distribution achieved by the second method of the present invention which utilizes a single crossover pressure variation. The pressure profile of the single crossover pressure variation used is illustrated in FIG. 10. FIG. 11 shows an example of final $H_2$ concentration distribution by the second method of the present invention which utilizes a double crossover pressure variation. The pressure profile of the double crossover pressure variation used is illustrated in FIG. 12.

Another example of loading times for variable hydrogen partial pressure loading schemes (assuming 600° C. loading of a 270 mm×60 mm silica disk) is illustrated in TABLE V below:

TABLE V

| Loading time at full temperature | | [$H_2$] Max | [$H_2$] Min | Max External Concentration | Max Gradient |
|---|---|---|---|---|---|
| Minutes | Days | 10$^{17}$ | 10$^{17}$ | 10$^{17}$ | 10$^{17}$/cm |
| 40,000 | 28 | 1.20 | 0.97 | 10 | 0.07 |

Example 3

Figure 13:
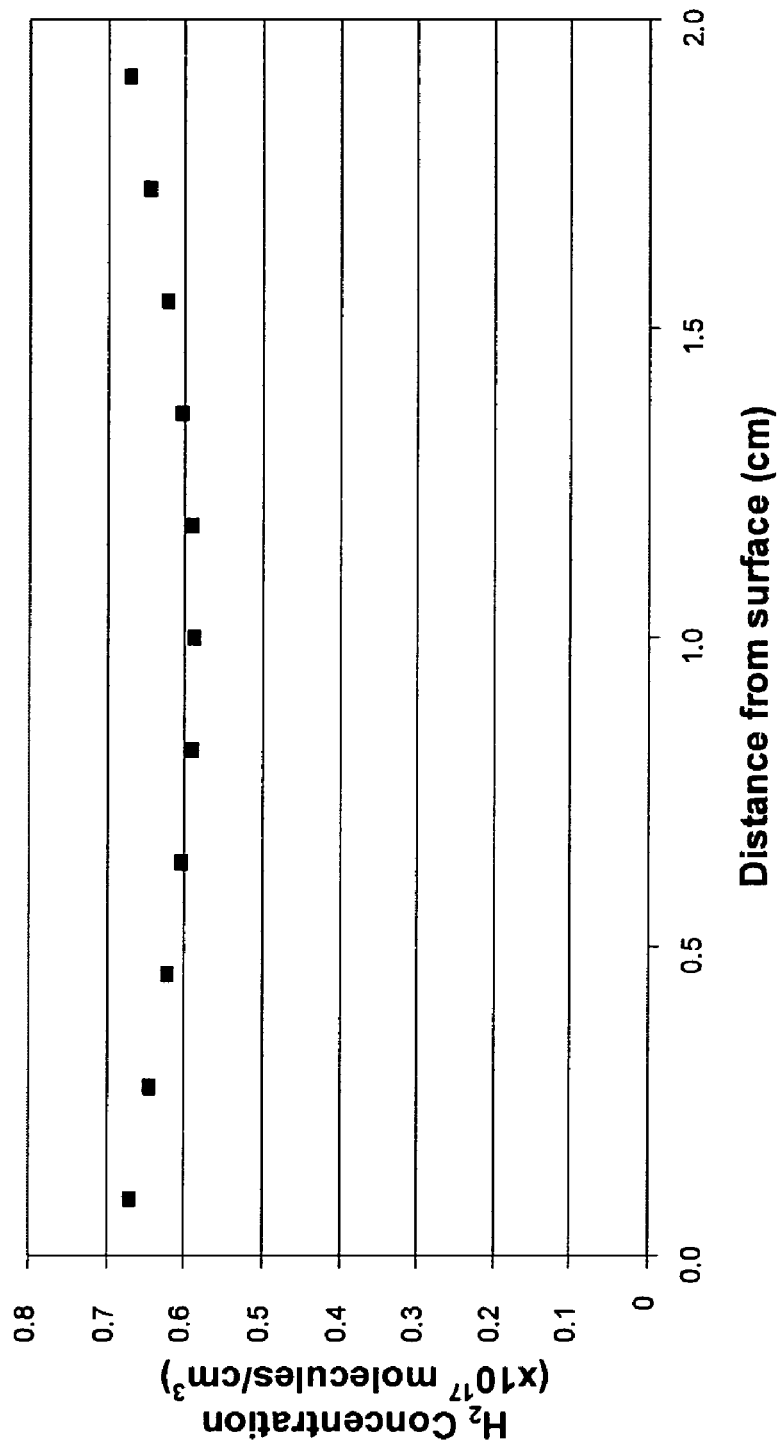
FIG. 13 is a diagram showing the $H_2$ concentration profile of a silica glass sample treated in an $H_2$-containing atmosphere with a constant $H_2$ partial pressure to result in an approximately 90% $H_2$ concentration at the center relative to the surface.

The experiment in this example was performed to validate the concept that varying the surface concentration of hydrogen during loading could significantly reduce loading time. Two cases were examined. Case I refers to glass that is loaded by "conventional loading". Here, conventional loading is defined as a constant surface concentration of $H_2$ during loading. FIG. 13 shows model predictions for loading a 20×25×100 mm$^3$ bar at 350° C. for 89.2 days at constant loading partial pressure of $H_2$. The results show that after the 89.2 days, a surface concentration of 0.7×10$^{17}$ molecules/cm$^3$ $H_2$ would be expected on the surface of the glass while 0.59×10$^{17}$ molecules/cm$^3$ $H_2$ would be expected in the sample center. The model prediction is based on the following equation:

$$D_{H_2} = (5.65 \times 10^{-4}) \cdot \exp(-5220/T)(\text{cm}^2/\text{sec})$$

where $D_{H_2}$ is the diffusivity of $H_2$ at temperature T (in Kelvin).

Figure 14:
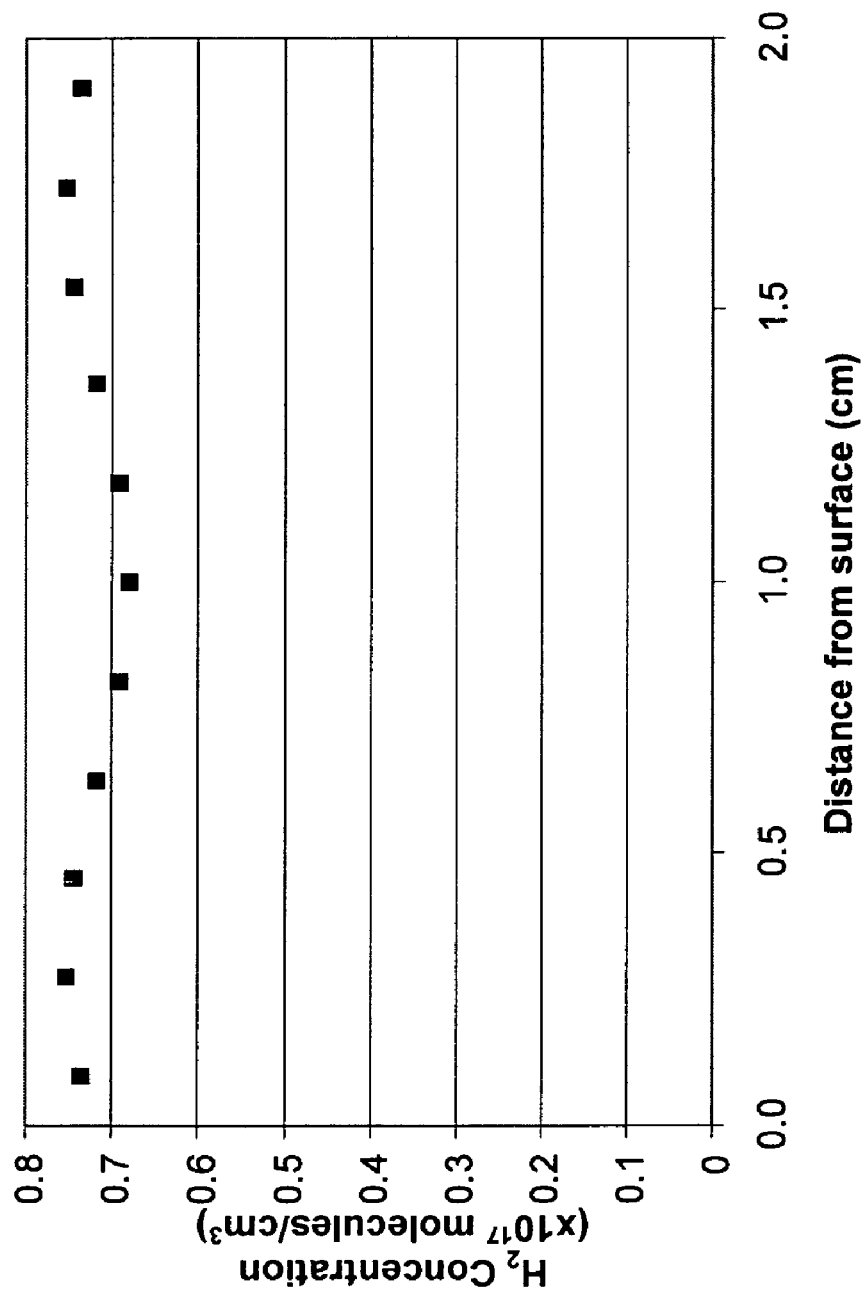
FIG. 14 is a diagram showing the $H_2$ concentration profile of a silica glass sample treated in an $H_2$-containing atmosphere with a varying $H_2$ partial pressure to result in an $H_2$ concentration gradient of less than 10%.

Case II refers to an example of accelerated loading procedures which vary the surface concentration of $H_2$ during loading. For this specific case, a targeted 4× reduction in loading time compared to Case I for a 20×25×100 mm sample was demonstrated. Thus the targeted loading time for Case II is ¼×89.2=22.3 (days). Additionally, another constraint was placed on the experiment. That is, the peak to valley $H_2$ concentration within case II had to be less than Case I. The model predictions are shown in FIG. 14. The $H_2$ partial pressure profile is represented by: 5.075 days at 695 psia (absolute pressure instead of gauge reading); 3.045 days at 0 psia; and then 14.18 days at 70 psia. Thus the surface concentration of the silica glass sample during the loading process is as follows:

| Time (min) | Surface $H_2$ concentration (×10$^{17}$ molecules/cm$^3$) |
|---|---|
| 0 | 7.00 |
| 7308 | 7.00 |
| 7309 | 0 |
| 11692 | 0 |
| 11693 | 0.70 |
| 32112 | 0.70 |

Calculation shows that a 4× reduction in loading time can be obtained while still obtaining a 2× reduction in peak to valley $H_2$ variations within the sample. This demonstrates the two potential benefits of varying the partial pressure of hydrogen during loading: reduced loading time and also reduced peak to valley $H_2$ concentrations within the part.

Figure 15:
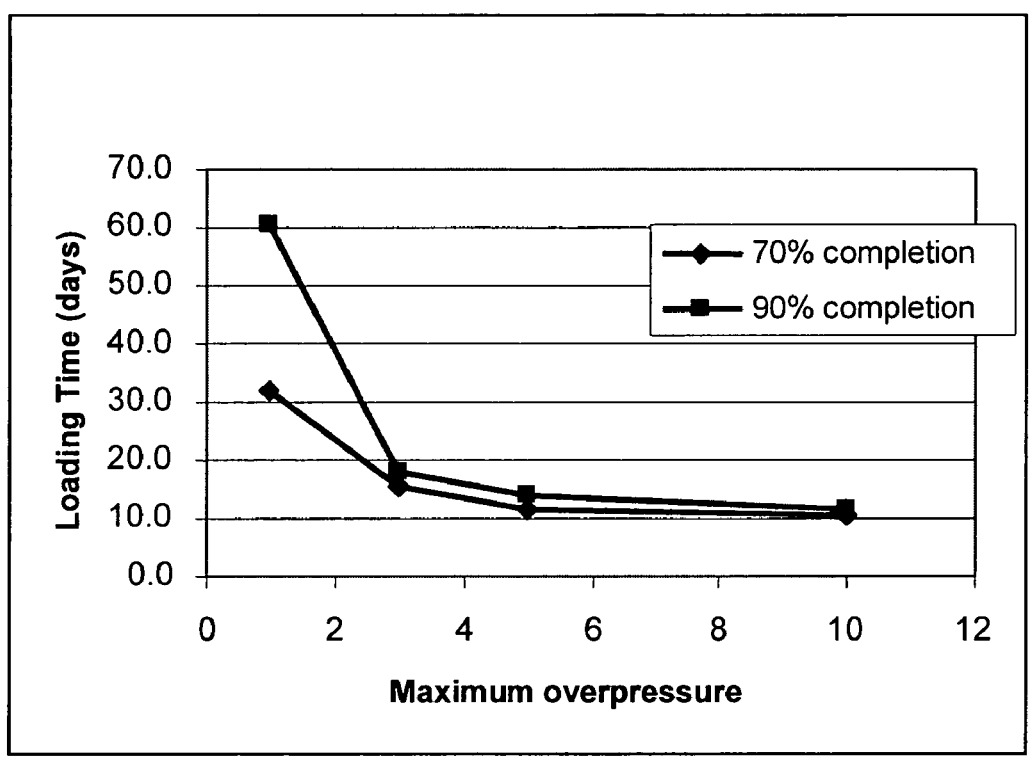
FIG. 15 is a diagram showing the hydrogen loading time as a function of the maximum overpressure of $H_2$ in the loading atmosphere.

Having established the value of using variable external pressure to speed $H_2$ loading, one needs to establish the added benefit of using increasingly high starting pressures in order to determine a practical manufacturing process. It has been found in the cases studied that using more than 5 times the desired final concentration provides little additional benefit, as show in FIG. 15. In this figure, shown on the vertical axis is the loading time required to achieve the respective center concentration (90% and 70% respectively) in a sample, and the on the horizontal axis are the ratio of the maximum overpressure used to the desired final concentration. Shown are optimized loading times for a thick part (using 1D approximation) using various maximum external pressures for two cases, a 90% loading profile (or 10% variation) and a 70% loading profile (30% variation). This trend (saturation after about 5 times pressure) also hold under other loading conditions.

Figure 16:
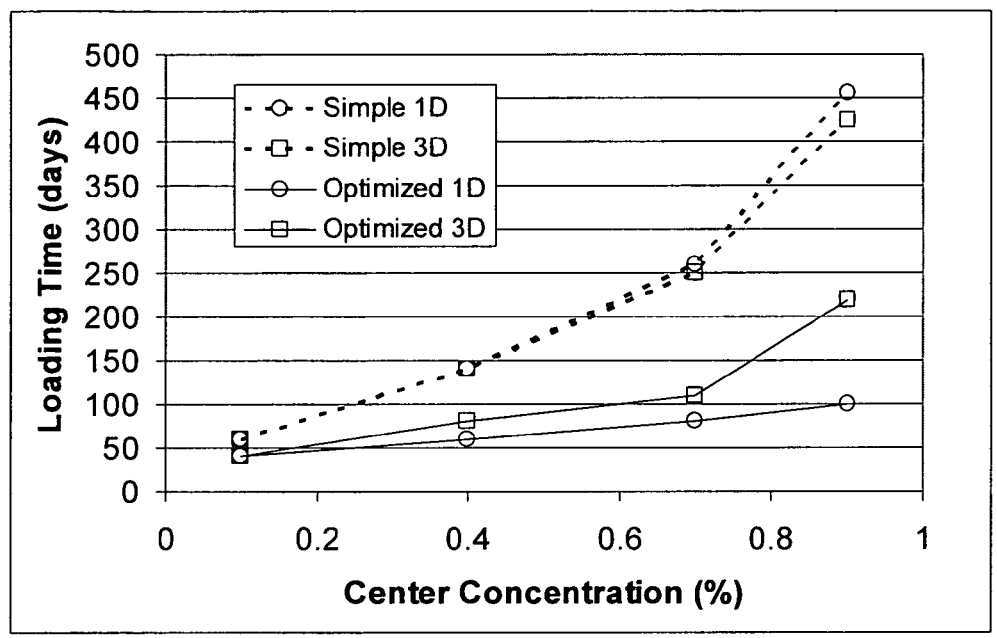
FIG. 16 is a diagram showing the hydrogen loading time as a function of center concentration for silica glass samples hydrogen loaded according to various embodiments of the process of the present invention.

FIG. 16 further shows the loading curves for a thick part (300 mm×90 mm) using simple (1×) and optimized (5×) overpressure. In this figure, 3D refers to the second method of the present invention where the hydrogen loading takes place from all surfaces of the sample including the side surfaces and main surfaces. 1D refers to the proposed further improvement where the cylindrical sides of the part are blocked from $H_2$ diffusion thus hydrogen diffusion occurs exclusively from the main surfaces.

Figure 17:
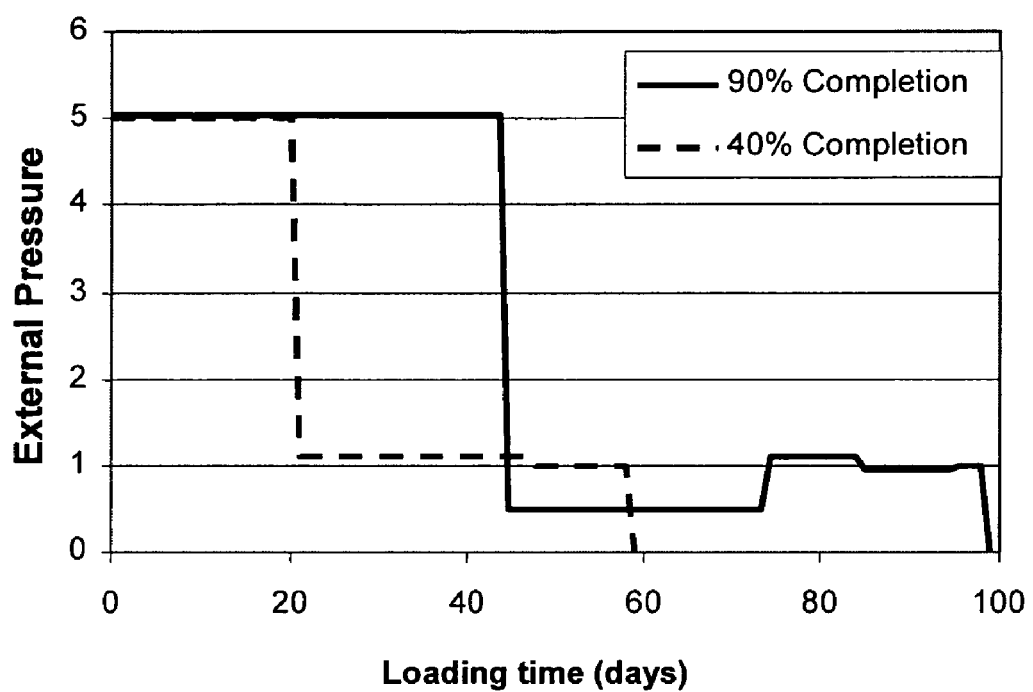
FIG. 17 is a diagram showing the varying hydrogen partial pressure profiles of two embodiments of the process of the present invention to achieve 90% and 40% center $H_2$ concentration relative to the surface concentration, respectively.
Figure 18:
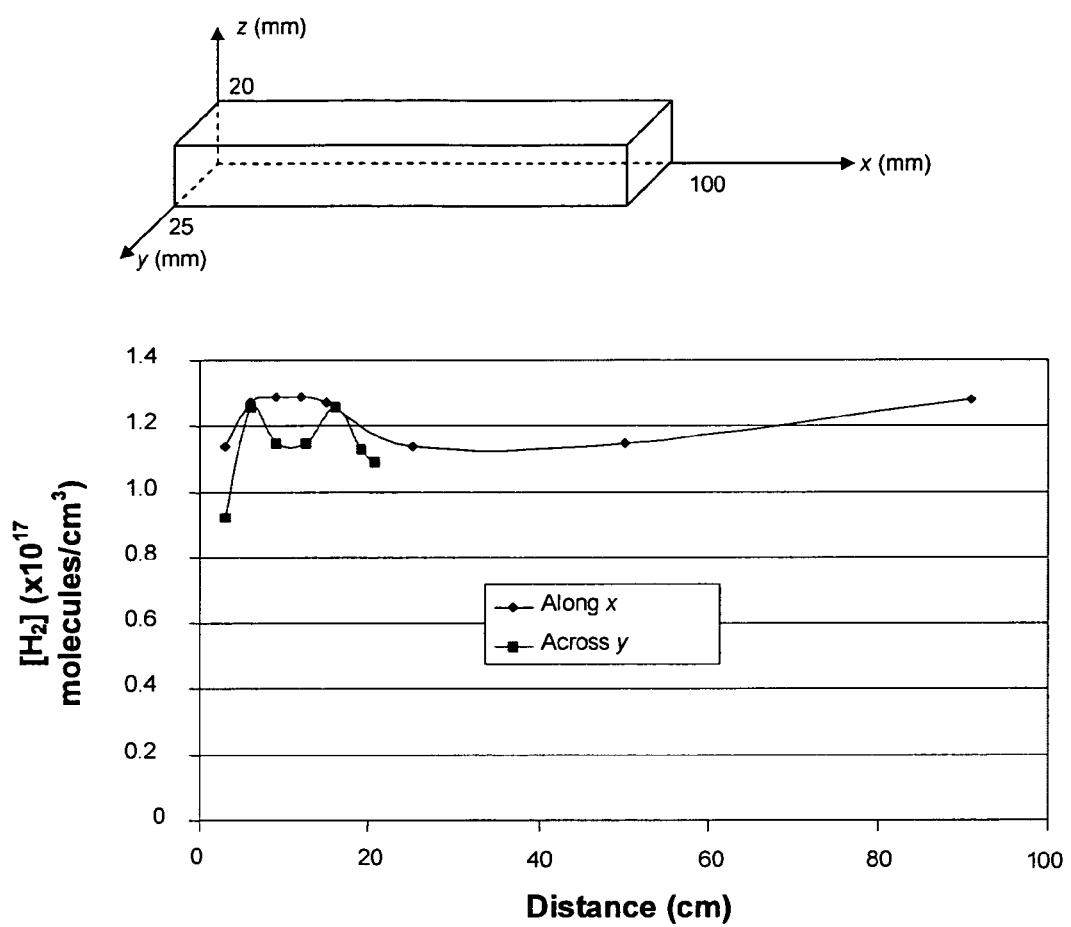
FIG. 18 is a diagram showing the $H_2$ concentration profile of a glass sample indicated therein upon hydrogen loading according to an embodiment of the process of the present invention.
Figure 19:
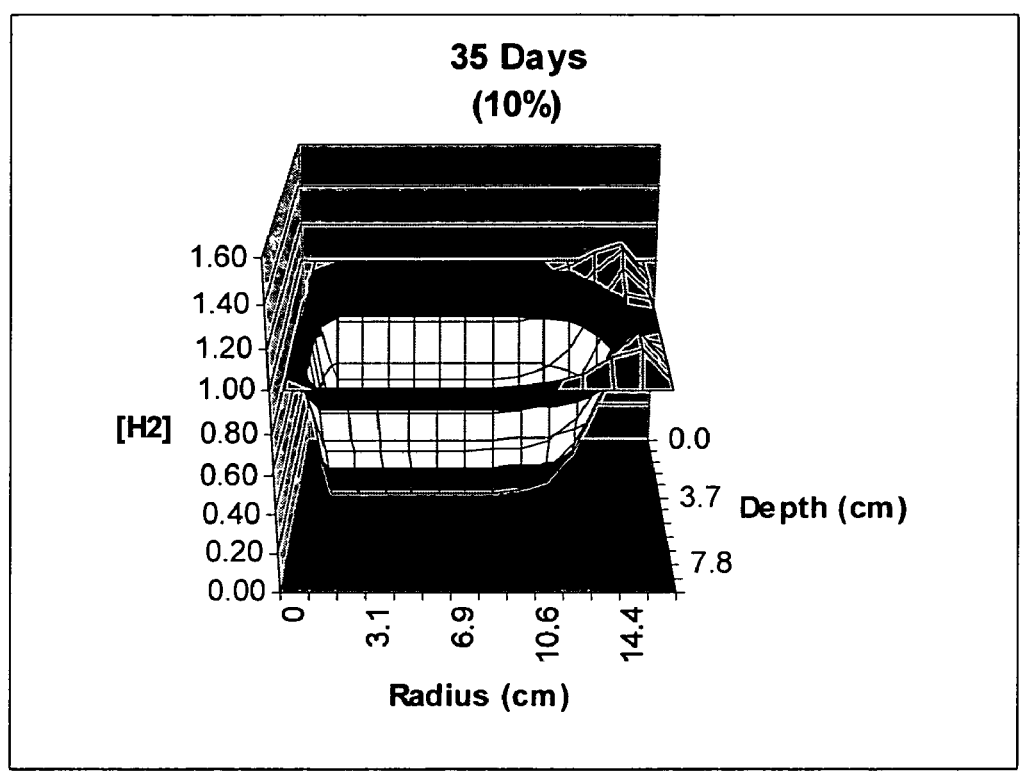
FIGS. 19-23 are diagrams showing the $H_2$ concentration profiles of a glass sample at various loading stage.
Figure 20:
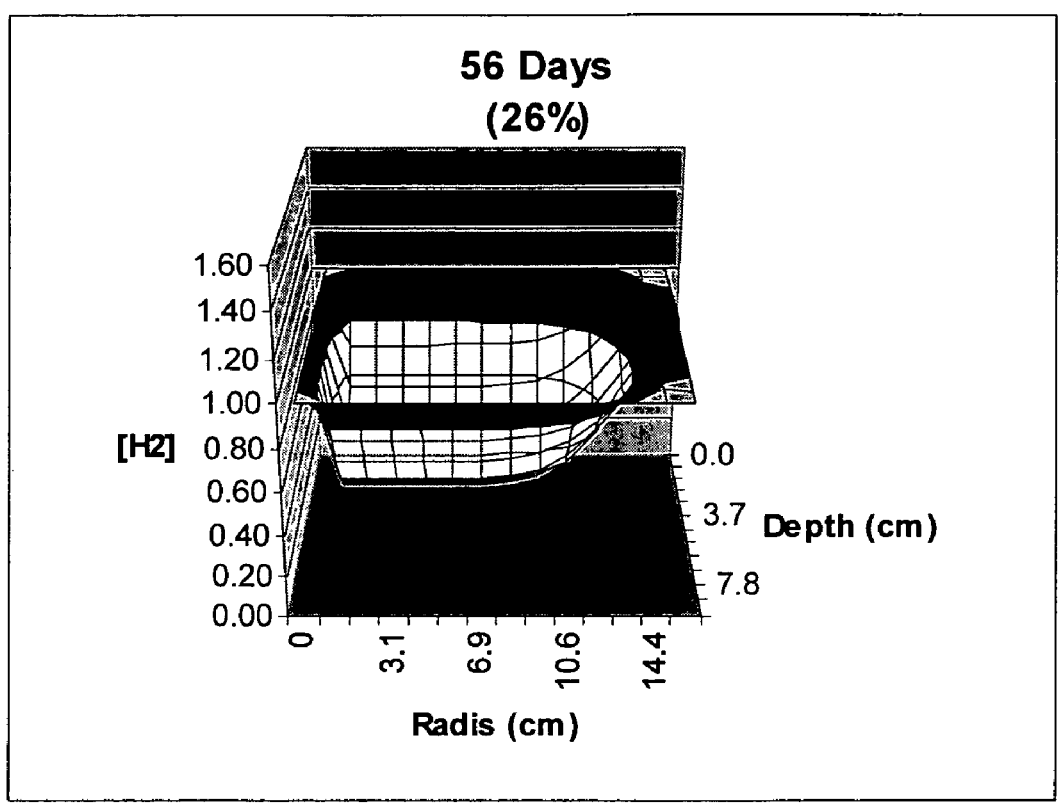
Figure 21:
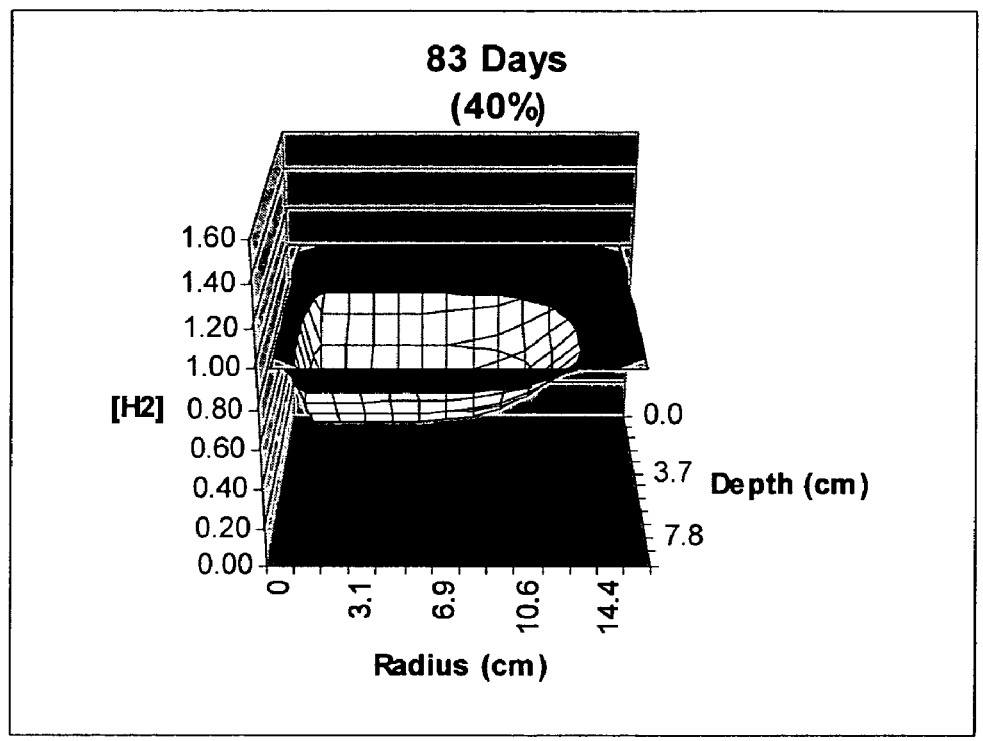
Figure 22:
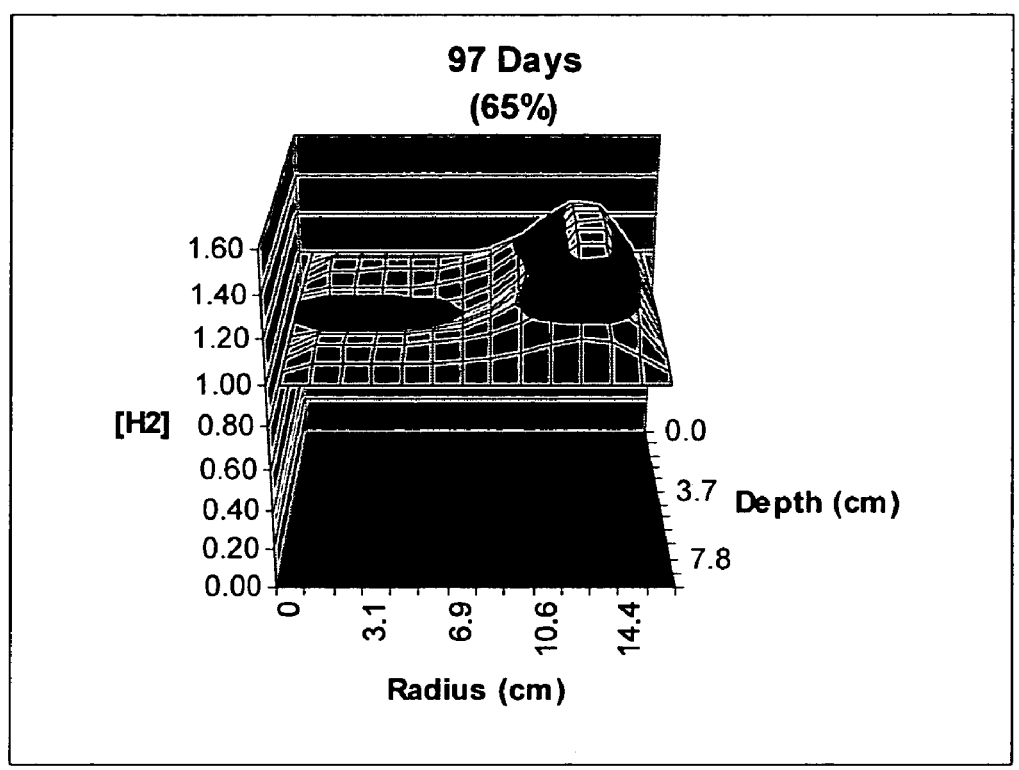
Figure 23:
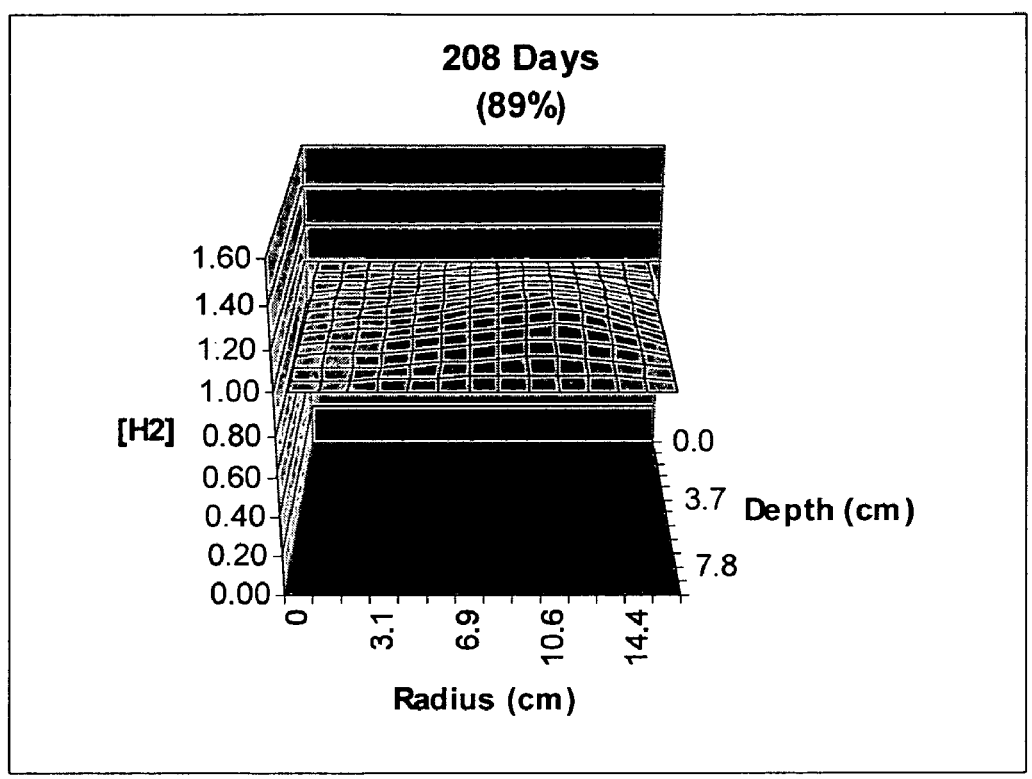

A sample was next subjected to the conditions outlined for case II. Experimental results from 20×25×100 mm silica bar processed according to conditions outlined in FIG. 17 showing that $H_2$ level is uniform and has shape as predicted. The absolute value in bar is higher than predicted but this is attributed to uncertainty in $H_2$ solubility and disagreement among absolute value measurements in $H_2$ metrology in silica. These results are shown in FIG. 18 indicating uniform $H_2$ levels within the glass were obtained. The absolute value of the $H_2$ level in the bar was experimentally higher than predicted, but this is attributed primarily to uncertainty (A) with solubility of $H_2$ for given partial pressure of hydrogen in atmosphere and (B) variations in Raman metrology between pieces of equipment. The model predicts accelerated loading possible and this experiment validates the concept. Until about 90 days the center of the part is the region varying most from the target concentration, which is similar to the evolution of a 1D geometry. As loading continues above about 90 days a region inside the outer circumference begins to define the maximum variation from nominal (target) due to the effect of the multiple diffusion paths delivering $H_2$ to that region. This is the manifestation of 3D effects and accounts for the significantly longer loading time to get to 90% completion of a real 3D part. FIGS. 19-23 shows the $H_2$ concentration profile in the sample at various loading times.

II. Types of Index Distributions

A. Further Modifications:

Because lens blanks can be fairly thick they can develop a concentration bulge near the outer edge when using the second process of the present invention since diffusion proceeds from the side as well as the top and bottom. That is, the disk is too thick to behave in a simple 1D fashion. This concentration bulge may determine the loading time because it can form the highest gradient in concentration. A protective barrier placed against the blank at the outer radius could improve loading time by confining diffusion to the top and bottom of the blank. There are some materials in which $H_2$ diffusion is significantly slower than in silica, including graphite. Use of such materials to reduce $H_2$ diffusion through the outer radius represents an embodiment of the process of the present invention.

B. Different Acceptable Index Distributions:

The second method of the present invention is more prone to higher order inhomogeneities (higher order Zernikes) than that produced by the first method which does not involve the use of varying hydrogen partial pressure in the hydrogen treatment atmosphere. The low order Zernikes such as that produced by the first method of the present invention typically has a looser specification than higher order terms or residuals. It is also noted that the majority of the inhomogeneities produced by the teachings of this invention will be oriented in axis 3 of the part. This is the axis that typically has the loosest specifications.

Figure 24:
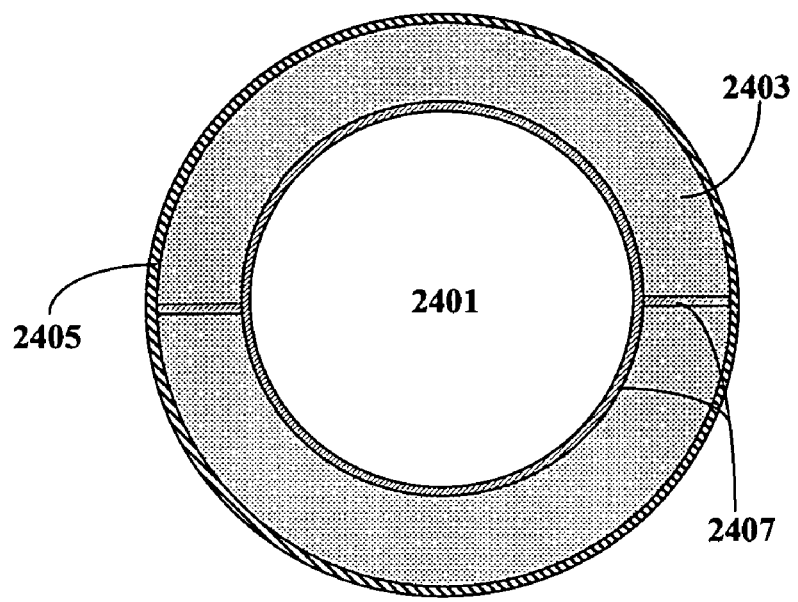
FIG. 24 is a schematic illustration of setting up $H_2$ diffusion barriers to effect selective $H_2$ loading into a silica glass sample according to an embodiment of the process of the present invention.

One embodiment of the idea to restrict hydrogen diffusion into the circumferential edges of the silica blank is schematically illustrated in FIG. 24:

A buffer (split) ring of glass 2403, possibly ULE™, surrounds the part 2401 to be hydrogen loaded. A compliant high temperature, diffusion resistant material 2407, such as Grafoil®, provides a diffusion seal between the ring segments and the part to be loaded. A compression band 2405 keeps the split ring segments tight against each other and the part to be loaded.

The effect of this buffer ring is to displace the concentration bulge noted in the case illustrated above out of the silica part and into the buffer glass.

In principle there is no reason the buffer glass cannot be used repeatedly. It can be quickly outgassed at higher temperatures between uses.

Alternatively, a thin, oxygen rich silica could be used as the buffer glass, as this will inhibit diffusion of $H_2$ due to reactions which consumes $H_2$. However, this alternative would entail creation of a new ring for each application.

It will be apparent to those skilled in the art that various modifications and alterations can be made to the present invention without departing from the scope and spirit of the invention. Thus, it is intended that the present invention cover the modifications and variations of this invention provided they come within the scope of the appended claims and their equivalents.

What is claimed is:

1. A silica glass material capable of being used in the light path of the lithographic irradiation of lithographic devices operating at a wavelength of below about 300 nm doped with molecular hydrogen having an average molecular hydrogen concentration $[H_2](avg)$ not lower than about $5 \times 10^{15}$ molecules/cm$^3$ and not higher than about $1 \times 10^{18}$ molecules/cm$^3$, a maximal molecular hydrogen concentration $[H_2](max)$ and a minimal molecular hydrogen concentration $[H_2](min)$, wherein $0.10 \leq [H_2](min)/[H_2](max) \leq 0.95$, and less than 0.3 ppm variation in index of refraction, and wherein the silica glass material has a LIWFD measured at 633 nm of between $-1.0$ and $1.0$ nm/cm when subjected to 10 billion pulses of a laser at approximately 193 nm, the laser operating at a fluence of approximately 70 µJ/cm$^2$.

2. A silica glass material in accordance with claim 1 having a $[H_2](avg)$ of not higher than about $4 \times 10^{17}$ molecules/cm$^3$.

3. A silica glass material in accordance with claim 1 having a $[H_2](avg)$ of not lower than about $1 \times 10^{16}$ molecules/cm$^3$.

4. A silica glass material in accordance with claim 1, wherein the silica glass material exhibits FDT of less than about $1.0 \times 10^{-4}$ cm·pulse/mJ when exposed to an excimer laser at about 193 nm.

5. A silica glass material in accordance with claim 1, wherein the silica glass material exhibits birefringence of less than about 0.5 nm/cm.

6. A silica glass material in accordance with claim 1, wherein the silica glass material exhibits birefringence variation of less than about 1 nm/cm.

7. A silica glass material in accordance with claim 1, wherein the silica glass material has a concentration of oxygen molecules of less than about $1 \times 10^{15}$ molecules/cm$^3$.

8. A silica glass material in accordance with claim 1, wherein the silica glass material exhibits an induced absorption at about 193 nm of less than about 0.01/cm after about 5 billion of pulses at a fluence of about 600 µJ·cm-2·pulse$^{-1}$ and a pulse length of about 25 ns.

9. A silica glass material in accordance with claim 1 essentially free of —O—O— bonds.

10. A silica glass material in accordance with claim 1 which has an average [OH] less than about 100 ppm.

11. A silica glass material in accordance with claim 1, wherein the silica glass material has a Cl concentration of less than about 50 ppm by weight, and a concentration of metals of less than or equal to 200 ppb by weight.

12. A method of producing silica glass material capable of being used in the light path of the lithographic irradiation of a lithographic device operating at a wavelength of below about 300 nm, comprising a step of treating the glass material in a hydrogen-containing atmosphere such that at the end of the treatment the silica glass material has an average molecular hydrogen concentration $[H_2](avg)$ not lower than about $5 \times 10^{15}$ molecules/cm$^3$ and not higher than about $1 \times 10^{18}$ molecules/cm$^3$, wherein a hydrogen concentration gradient exists through the depth of the material, said hydrogen concentration gradient having a maximum molecular hydrogen concentration $[H_2](max)$ and a minimum molecular hydrogen concentration $[H_2](min)$, wherein $0.10 \leq [H_2](min)/[H_2](max) \leq 0.95$, leading to a variation in index of refraction of less than 0.3 ppm, and wherein the silica glass material has a LIWFD measured at 633 nm of between $-1.0$ and $1.0$ nm/cm when subjected to 10 billion pulses of a laser at approximately 193 nm, the laser operating at a fluence of approximately 70 µJ/cm$^2$.

13. A method according to claim 12, wherein during the hydrogen treatment process, the partial pressure of hydrogen in the hydrogen-containing atmosphere remains essentially constant.

14. A method according to claim 12, wherein during the hydrogen treatment process, the partial pressure of hydrogen in the hydrogen-containing atmosphere is less than about 50 atm.

15. A method according to claim 12, wherein at the end of the hydrogen treatment process, the lowest hydrogen concentration in the material ($[H_2]$(min)) and the highest hydrogen concentration in the material ($[H_2]$(max)) satisfy the following relationship: $0.1 \leq [H_2](min)/[H_2](max) \leq 0.7$.

16. A method according to claim 12, wherein the silica glass material prior to being treated in the hydrogen-containing atmosphere comprises hydrogen at a concentration below about $1 \times 10^{16}$ molecules/cm$^3$.

17. A method according to claim 12, wherein at the end of treating the silica glass material in the hydrogen-containing atmosphere, the highest hydrogen concentration in the material is less than about $2 \times 10^{18}$ molecules/cm$^3$.

18. A method according to claim 12, wherein at the end of treating the silica glass material in the hydrogen-containing atmosphere, the lowest hydrogen concentration in the material is not lower than about $1 \times 10^{16}$ molecules/cm$^3$.

19. A method according to claim 12, wherein the temperature at which the silica glass material is treated in the hydrogen-containing atmosphere is about 1000° C. or lower.

20. A method according to claim 12, wherein during the process of treating the silica glass material in the hydrogen-containing atmosphere, at least part of the surface of the material is shielded with a hydrogen diffusion barrier such that hydrogen molecules are allowed to enter into the body of the glass material only through selected surface areas.

21. A method according to claim 12, wherein during the process of treating the silica glass in the hydrogen-containing atmosphere, the partial pressure of hydrogen is varied.

22. A method according to claim 21, wherein during the process of treating the silica glass in the hydrogen-containing atmosphere, the partial pressure of hydrogen is set at the maximum during the initial loading stage.

23. A method according to claim 21, wherein during the process of treating the silica glass in the hydrogen-containing atmosphere, the partial pressure of hydrogen was set to essentially zero during a certain period thereof.

24. A method according to claim 21, wherein during the process of treating the silica glass in the hydrogen-containing atmosphere, the maximal partial pressure of hydrogen is set to below about 5 atm.

25. A method according to claim 21, wherein during the process of treating the silica glass in the hydrogen-containing atmosphere, the maximal partial pressure of hydrogen is set to below about 5 times of the equilibrium pressure corresponding to the highest $H_2$ concentration in the glass at the end of the hydrogen treatment.

26. A method according to claim 21, wherein at the end of the hydrogen treatment process, the lowest hydrogen concentration in the material ($[H_2]$(min)) and the highest hydrogen concentration in the material ($[H_2]$(max)) satisfy the following relationship: $0.2 \leq [H_2](min)/[H_2](max) \leq 0.7$.

27. A method according to claim 21, wherein at the end of the hydrogen treatment process, the lowest hydrogen concentration in the material ($[H_2]$(min)) and the highest hydrogen concentration in the material ($[H_2]$(max)) satisfy the following relationship: $0.4 \leq [H_2](min)/[H_2](max) \leq 0.95$.

28. A method according to claim 21, wherein the silica glass material prior to being treated in the hydrogen-containing atmosphere comprises hydrogen at a concentration below about $1 \times 10^{16}$ molecules/cm$^3$.

29. A method according to claim 21, wherein at the end of treating the silica glass material in the hydrogen-containing atmosphere, the highest hydrogen concentration in the material is less than about $2 \times 10^{18}$ molecules/cm$^3$.

30. A method according to claim 21, wherein at the end of treating the silica glass material in the hydrogen-containing atmosphere, the lowest hydrogen concentration in the material is higher than about $1 \times 10^{16}$ molecules/cm$^3$.

31. A method according to claim 21, wherein the temperature at which the silica glass material is treated in the hydrogen-containing atmosphere is about 1000° C. or lower.

32. A method according to claim 21, wherein during the process of treating the silica glass material in the hydrogen-containing atmosphere, at least part of the surface of the material is shielded with a hydrogen diffusion barrier such that hydrogen molecules are allowed to enter into the body of the glass material only through selected surface areas.

33. A method of producing silica glass material having an average hydrogen concentration $[H_2]$(avg) not lower than about $5 \times 10^{15}$ molecules/cm$^3$ and not higher than about $1 \times 10^{18}$ molecules/cm$^3$, a maximal hydrogen concentration $[H_2]$(max) and a minimal hydrogen concentration $[H_2]$(min) wherein $0.10 \leq [H_2](min)/[H_2](max) \leq 0.95$, less than 0.3 ppm variation in index of refraction, and a LIWFD measured at 633 nm of between −1.0 and 1.0 nm/cm when subjected to 10 billion pulses of a laser at approximately 193 nm, the laser operating at a fluence of approximately 70 µJ/cm$^2$, the material being capable of being used in the light path of the lithographic irradiation of a lithographic device operating at a wavelength of below about 300 nm, comprising the following steps:

(I) providing a silica soot preform comprising a plurality of silica soot particles;

(II) treating the silica soot preform in an oxygen-containing atmosphere;

(III) consolidating the silica soot preform to dense glass; and (IV) treating the consolidated silica glass in a hydrogen-containing atmosphere with varied hydrogen partial pressure, wherein a hydrogen partial pressure higher than the equilibrium hydrogen partial pressure corresponding to $[H_2]$(max) is employed at the during the initial stage of this step (IV) such that the —O—O— bonds and/or $O_2$ molecules in the glass are quickly consumed.

34. A method according to claim 33, wherein during step (IV), the maximal hydrogen partial pressure is employed during the initial stage of step (IV).

35. A method according to claim 33, wherein in step (IV), the partial pressure of hydrogen was set to essentially zero during a certain period thereof.

36. A method according to claim 33, wherein during step (IV), the maximal hydrogen partial pressure is set to below about 5 atm.

37. A method according to claim 33, wherein at the end of the hydrogen treatment process, the lowest hydrogen concentration in the material ($[H_2]$(min)) and the highest hydrogen concentration in the material ($[H_2]$(max)) satisfy the following relationship: $0.2 \leq [H_2](min)/[H_2](max) \leq 0.7$.

38. A method according to claim 33, wherein at the end of the hydrogen treatment process, the lowest hydrogen concentration in the material ($[H_2]$(min)) and the highest hydrogen concentration in the material ($[H_2]$(max)) satisfy the following relationship: $0.4 \leq [H_2](min)/[H_2](max) \leq 0.95$.

39. A method according to claim 33, wherein the silica glass material prior to treating in the hydrogen-containing atmosphere comprises hydrogen at a concentration below about $1 \times 10^{16}$ molecules/cm$^3$.

40. A method according to claim 33, wherein at the end of treating the silica glass material in the hydrogen-containing atmosphere, the highest hydrogen concentration in the material is less than about $2 \times 10^{18}$ molecules/cm$^3$.

41. A method according to claim 33, wherein the temperature at which the silica glass material is treated in the hydrogen-containing atmosphere is about 1000° C. or lower.

42. A method according to claim 33, wherein at the end of treating the silica glass material in the hydrogen-containing atmosphere, the lowest hydrogen concentration in the material is higher than about $1\times10^{16}$ molecules/cm$^3$.

43. A method according to claim 33, wherein during the process of treating the silica glass in the hydrogen-containing atmosphere, the maximal partial pressure of hydrogen is set to below about 5 times of the equilibrium pressure corresponding to the highest $H_2$ concentration in the glass at the end of the hydrogen treatment.

44. A method according to claim 33, wherein during the process of treating the silica glass material in the hydrogen-containing atmosphere, at least part of the surface of the material is shielded with a hydrogen diffusion barrier such that hydrogen molecules are allowed to enter into the body of the glass material only through selected surface areas.

* * * * *